(12) United States Patent
Hino

(10) Patent No.: US 7,840,922 B2
(45) Date of Patent: Nov. 23, 2010

(54) SEMICONDUCTOR DESIGN SUPPORT APPARATUS

(75) Inventor: Fumiko Hino, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 364 days.

(21) Appl. No.: 11/635,661

(22) Filed: Dec. 8, 2006

(65) Prior Publication Data

US 2007/0136712 A1      Jun. 14, 2007

(30) Foreign Application Priority Data

Dec. 9, 2005    (JP) ............................. 2005-355814

(51) Int. Cl.
    G06F 17/50    (2006.01)
(52) U.S. Cl. .......................................... 716/5
(58) Field of Classification Search ................ 716/1–18
    See application file for complete search history.

(56) References Cited

U.S. PATENT DOCUMENTS 6,366,690 B1    4/2002   Smilansky et al.

2003/0016560 A1    1/2003   Kawamura
2006/0090146 A1*   4/2006   LeBritton et al. .............. 716/4
2007/0061771 A1*   3/2007   Habitz et al. .................. 716/21

FOREIGN PATENT DOCUMENTS

| JP | 2003-036285 | 2/2003 |
| JP | 2004-102702 (A) | 4/2004 |
| JP | 2004-145712 (A) | 5/2004 |
| TW | 439165 | 6/2001 |
| TW | 546653 | 8/2003 |

* cited by examiner

*Primary Examiner*—Vuthe Siek
*Assistant Examiner*—Aric Lin
(74) *Attorney, Agent, or Firm*—Foley & Lardner LLP

(57) ABSTRACT

The semiconductor design support apparatus relating to the layout verification. For executing layout verification in high accuracy, the apparatus includes a unit for generating a recognition pattern in a region having a first axis of symmetry and a second axis of symmetry orthogonal to the first axis. The recognition pattern is asymmetric to both first and second axes. The layout execution unit determines the layout of a macrocell including the recognition pattern to generate layout pattern data. The layout verification unit read the pattern data of the recognition pattern included in the macrocell based on the layout pattern data and verify the arrangement direction of the macrocell based on the recognition pattern.

9 Claims, 36 Drawing Sheets

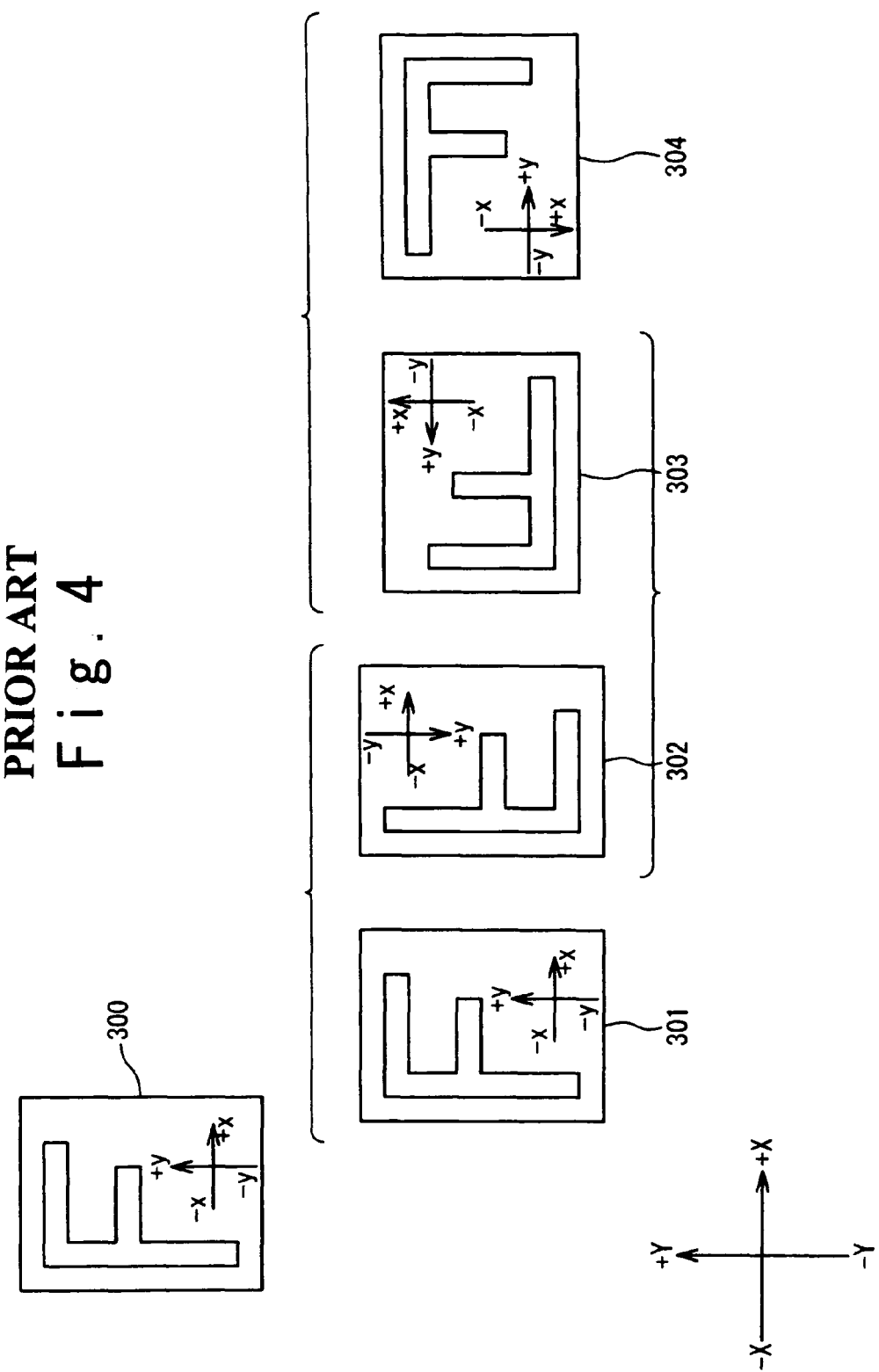

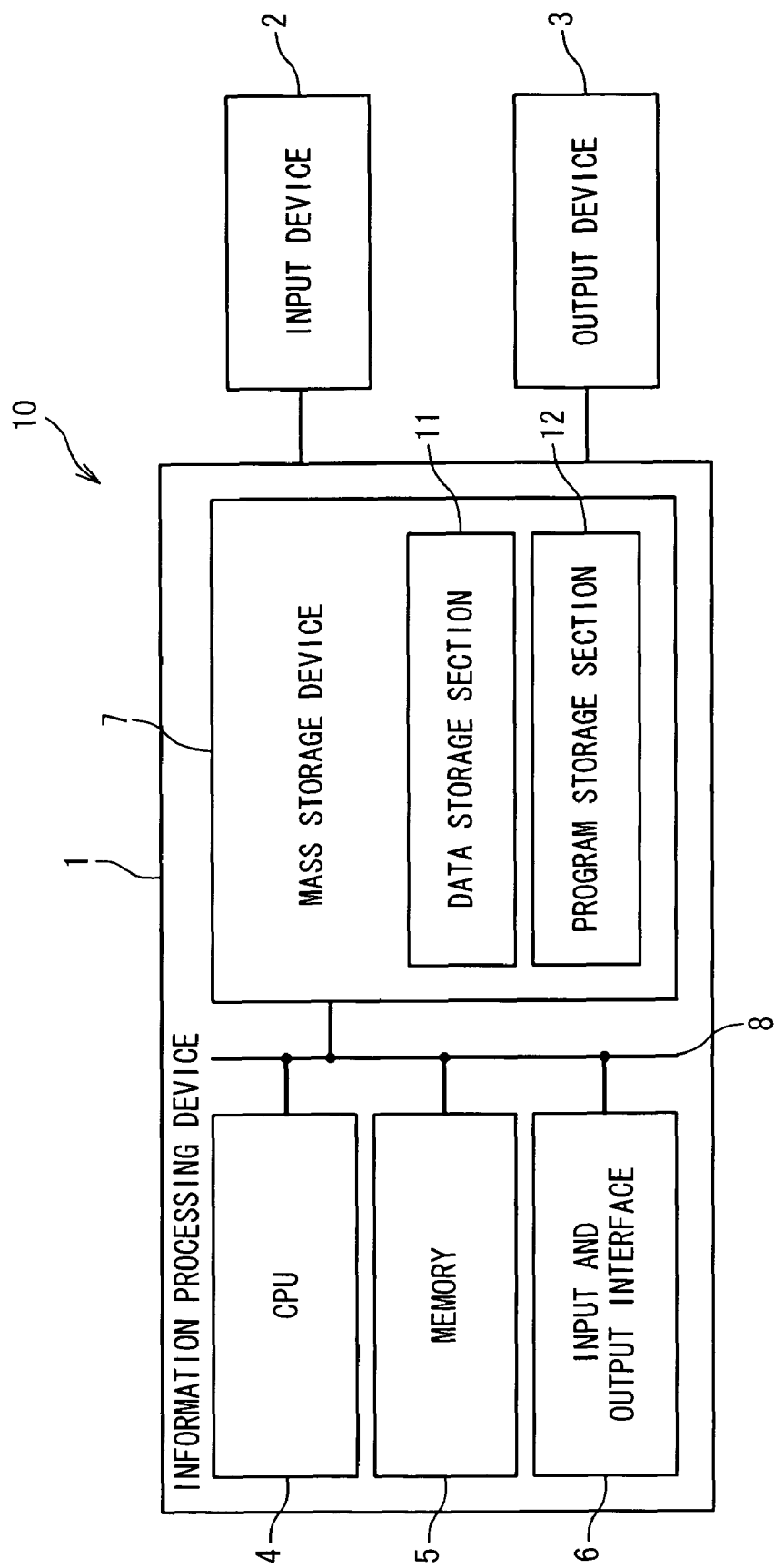

Fig. 11

| Condition | (Arrangement angle to reference pattern) | | Verification requirement | First pattern data changing target portion | Change amount | Change direction (external coordinate) |
|---|---|---|---|---|---|---|
| First Condition | 0 degree |  | First condition verification requirement | First side | First length | -Y direction |
| Second Condition | 90 degree |  | Second condition verification requirement | Second side | Second length | +X direction |
| Third Condition | 180 degree |  | Third condition verification requirement | Third side | First length | +Y direction |
| Fourth Condition | 270 degree |  | Fourth condition verification requirement | Fourth side | Second length | +Y direction |
| Fifth Condition | 0 degree + mirror |  | Fifth condition verification requirement | Second side | First length | +Y direction |
| Sixth Condition | 90 degree + mirror |  | Sixth condition verification requirement | First side | Second length | -X direction |
| Seventh Condition | 180 degree + mirror |  | Seventh condition verification requirement | Fourth side | First length | -Y direction |
| Eighth Condition | 270 degree + mirror |  | Eighth condition verification requirement | Third side | Second length | -X direction |

| Condition | Arrangement angle | Shape | Verification requirement | First pattern data changing target portion | Change amount | Change direction |
|---|---|---|---|---|---|---|
| First | 0 degree | | First | First side | First length | -Y |
| Second | 90 degree | | Second | Second side | Second length | +X |
| Third | 180 degree | | Third | Second side | First length | +X |
| Fourth | 270 degree | | Fourth | Third side | Second length | +Y |
| Fifth | 0 degree + mirror | | Fifth | Fourth side | First length | +Y |
| Sixth | 90 degree + mirror | | Sixth | First side | Second length | -X |
| Seventh | 180 degree + mirror | | Seventh | Second side | First length | -Y |
| Eighth | 270 degree + mirror | | Eighth | Third side | Second length | +X |

Fig. 12

| EXECUTION RESULT / VERIFICATION TARGET CONDITION | FIRST CONDITION VERIFICATION REQUIREMENT | | SECOND CONDITION VERIFICATION REQUIREMENT | | THIRD CONDITION VERIFICATION REQUIREMENT | | FOURTH CONDITION VERIFICATION REQUIREMENT | |
|---|---|---|---|---|---|---|---|---|
| | SECOND PATTERN DATA | THIRD PATTERN DATA | SECOND PATTERN DATA | THIRD PATTERN DATA | SECOND PATTERN DATA | THIRD PATTERN DATA | SECOND PATTERN DATA | THIRD PATTERN DATA |
| FIRST CONDITION | OVERLAP | OVERLAP | | | | | | |
| SECOND CONDITION | | | OVERLAP | OVERLAP | | | | |
| THIRD CONDITION | | | | | OVERLAP | OVERLAP | | |
| FOURTH CONDITION | | | | | | | OVERLAP | OVERLAP |
| FIFTH CONDITION | | | | | | | | |
| SIXTH CONDITION | | | | | | | | |
| SEVENTH CONDITION | | | | | | | | |
| EIGHTH CONDITION | | | | | | | | |

| EXECUTION RESULT / VERIFICATION TARGET CONDITION | FIFTH CONDITION VERIFICATION REQUIREMENT | | SIXTH CONDITION VERIFICATION REQUIREMENT | | SEVENTH CONDITION VERIFICATION REQUIREMENT | | EIGHTH CONDITION VERIFICATION REQUIREMENT | |
|---|---|---|---|---|---|---|---|---|
| | SECOND PATTERN DATA | THIRD PATTERN DATA | SECOND PATTERN DATA | THIRD PATTERN DATA | SECOND PATTERN DATA | THIRD PATTERN DATA | SECOND PATTERN DATA | THIRD PATTERN DATA |
| FIRST CONDITION | | | | | | | | |
| SECOND CONDITION | | | | | | | | |
| THIRD CONDITION | | | | | | | | |
| FOURTH CONDITION | | | | | | | | |
| FIFTH CONDITION | OVERLAP | OVERLAP | | | | | | |
| SIXTH CONDITION | | | OVERLAP | OVERLAP | | | | |
| SEVENTH CONDITION | | | | | OVERLAP | OVERLAP | | |
| EIGHTH CONDITION | | | | | | | OVERLAP | OVERLAP |

| CONDITION | ARRANGEMENT ANGLE TO REFERENCE PATTERN | VERIFICATION REQUIREMENT | CHANGE TARGET VERTEX | CHANGE DIRECTION (EXTERNAL COORDINATE) | VERIFICATION TARGET LENGTH |
|---|---|---|---|---|---|
| FIRST CONDITION | 0 DEGREE | FIRST CONDITION VERIFICATION REQUIREMENT | -Y DIRECTION VERTEX | -Y DIRECTION | LENGTH BETWEEN VERTEXES E AND F: ** um |
| SECOND CONDITION | 90 DEGREE | SECOND CONDITION VERIFICATION REQUIREMENT | +X DIRECTION VERTEX | +X DIRECTION | LENGTH BETWEEN VERTEXES C AND D: ** um |
| THIRD CONDITION | 180 DEGREE | THIRD CONDITION VERIFICATION REQUIREMENT | -Y DIRECTION VERTEX | -Y DIRECTION | LENGTH BETWEEN VERTEXES G AND H: ** um |
| FOURTH CONDITION | 270 DEGREE | FOURTH CONDITION VERIFICATION REQUIREMENT | +X DIRECTION VERTEX | +X DIRECTION | LENGTH BETWEEN VERTEXES E AND F: ** um |
| FIFTH CONDITION | 0 DEGREE + MIRROR | FIFTH CONDITION VERIFICATION REQUIREMENT | -Y DIRECTION VERTEX | -Y DIRECTION | LENGTH BETWEEN VERTEXES A AND B: ** um |
| SIXTH CONDITION | 90 DEGREE + MIRROR | SIXTH CONDITION VERIFICATION REQUIREMENT | +X DIRECTION VERTEX | +X DIRECTION | LENGTH BETWEEN VERTEXES C AND D: ** um |
| SEVENTH CONDITION | 180 DEGREE + MIRROR | SEVENTH CONDITION VERIFICATION REQUIREMENT | -Y DIRECTION VERTEX | -Y DIRECTION | LENGTH BETWEEN VERTEXES E AND F: ** um |
| EIGHTH CONDITION | 270 DEGREE + MIRROR | EIGHTH CONDITION VERIFICATION REQUIREMENT | +X DIRECTION VERTEX | +X DIRECTION | LENGTH BETWEEN VERTEXES A AND B: ** um |

Fig. 22

| CONDITION | (ARRANGEMENT ANGLE TO REFERENCE PATTERN) | | VERIFICATION REQUIREMENT | FIRST PATTERN DATA CHANGING TARGET PORTION | CHANGE DIRECTION (EXTERNAL COORDINATE) | CHANGE AMOUNT |
|---|---|---|---|---|---|---|
| FIRST CONDITION | 0 DEGREE | | FIRST CONDITION VERIFICATION REQUIREMENT | FIRST SIDE | −Y DIRECTION | THIRD LENGTH |
| | | | | SECOND SIDE | +X DIRECTION | FOURTH LENGTH |
| SECOND CONDITION | 90 DEGREE | | SECOND CONDITION VERIFICATION REQUIREMENT | SECOND SIDE | +X DIRECTION | THIRD LENGTH |
| | | | | THIRD SIDE | +Y DIRECTION | FOURTH LENGTH |
| THIRD CONDITION | 180 DEGREE | | THIRD CONDITION VERIFICATION REQUIREMENT | THIRD SIDE | +Y DIRECTION | THIRD LENGTH |
| | | | | FOURTH SIDE | −X DIRECTION | FOURTH LENGTH |
| FOURTH CONDITION | 270 DEGREE | | FOURTH CONDITION VERIFICATION REQUIREMENT | FOURTH SIDE | −X DIRECTION | THIRD LENGTH |
| | | | | FIRST SIDE | −Y DIRECTION | FOURTH LENGTH |
| FIFTH CONDITION | 0 DEGREE + MIRROR | | FIFTH CONDITION VERIFICATION REQUIREMENT | SECOND SIDE | +X DIRECTION | THIRD LENGTH |
| | | | | THIRD SIDE | +Y DIRECTION | FOURTH LENGTH |
| SIXTH CONDITION | 90 DEGREE + MIRROR | | SIXTH CONDITION VERIFICATION REQUIREMENT | SECOND SIDE | +X DIRECTION | THIRD LENGTH |
| | | | | FIRST SIDE | −Y DIRECTION | FOURTH LENGTH |
| SEVENTH CONDITION | 180 DEGREE + MIRROR | | SEVENTH CONDITION VERIFICATION REQUIREMENT | FOURTH SIDE | −X DIRECTION | THIRD LENGTH |
| | | | | FIRST SIDE | −Y DIRECTION | FOURTH LENGTH |
| EIGHTH CONDITION | 270 DEGREE + MIRROR | | EIGHTH CONDITION VERIFICATION REQUIREMENT | THIRD SIDE | +Y DIRECTION | THIRD LENGTH |
| | | | | FOURTH SIDE | −X DIRECTION | FOURTH LENGTH |

Fig. 23

| EXECUTION RESULT / VERIFICATION TARGET CONDITION | FIRST CONDITION VERIFICATION REQUIREMENT | | SECOND CONDITION VERIFICATION REQUIREMENT | | THIRD CONDITION VERIFICATION REQUIREMENT | | FOURTH CONDITION VERIFICATION REQUIREMENT | |
|---|---|---|---|---|---|---|---|---|
| | AREA OF FIRST EXECUTION RESULT | AREA OF SECOND EXECUTION RESULT | AREA OF FIRST EXECUTION RESULT | AREA OF SECOND EXECUTION RESULT | AREA OF FIRST EXECUTION RESULT | AREA OF SECOND EXECUTION RESULT | AREA OF FIRST EXECUTION RESULT | AREA OF SECOND EXECUTION RESULT |
| FIRST CONDITION | 3 | 4 | | | | | | |
| SECOND CONDITION | | | 3 | 4 | | | | |
| THIRD CONDITION | | | | | 3 | 4 | | |
| FOURTH CONDITION | | | | | | | 3 | 4 |
| FIFTH CONDITION | | | | | | | | |
| SIXTH CONDITION | | | | | | | | |
| SEVENTH CONDITION | | | | | | | | |
| EIGHTH CONDITION | | | | | | | | |

| EXECUTION RESULT / VERIFICATION TARGET CONDITION | FIFTH CONDITION VERIFICATION REQUIREMENT | | SIXTH CONDITION VERIFICATION REQUIREMENT | | SEVENTH CONDITION VERIFICATION REQUIREMENT | | EIGHTH CONDITION VERIFICATION REQUIREMENT | |
|---|---|---|---|---|---|---|---|---|
| | AREA OF FIRST EXECUTION RESULT | AREA OF SECOND EXECUTION RESULT | AREA OF FIRST EXECUTION RESULT | AREA OF SECOND EXECUTION RESULT | AREA OF FIRST EXECUTION RESULT | AREA OF SECOND EXECUTION RESULT | AREA OF FIRST EXECUTION RESULT | AREA OF SECOND EXECUTION RESULT |
| FIRST CONDITION | | | | | | | | |
| SECOND CONDITION | | | | | | | | |
| THIRD CONDITION | | | | | | | | |
| FOURTH CONDITION | | | | | | | | |
| FIFTH CONDITION | 3 | 4 | | | | | | |
| SIXTH CONDITION | | | 3 | 4 | | | | |
| SEVENTH CONDITION | | | | | 3 | 4 | | |
| EIGHTH CONDITION | | | | | | | 3 | 4 |

RECTANGLE DATA OF DOTTED
LINE IS RESIZED DATA A

RECTANGLE DATA OF
DOTTED LINE IS
RESIZED DATA A'

SEMICONDUCTOR DESIGN SUPPORT APPARATUS

BACKGROUND OF THE INVENTION

1. Field of the Invention

The present invention relates to a semiconductor design support apparatus and more specifically to an apparatus and a method for supporting a layout verification process in the design of semiconductor devices.

2. Description of the Related Art

With the proceedings of the development in semiconductor technology, semiconductor integrated circuits have been increasingly loaded in various products provided in the market. The designing of a semiconductor integrated circuit can be divided into several subsequent processes: typically, a system design process, a logic design process, and a layout design process are included.

In the system design process, functions and performance of the semiconductor integrated circuit are determined based on development plans. Then, in the logic design process, a logic circuit is created which realizes the determined functions and performance. Further, in the layout design process, operation of forming the created logic circuit as a mask pattern of the semiconductor integrated circuit is performed. Typically, the semiconductor integrated circuit is configured as a combination of circuits (macrocells) collected in some unit. In the layout design process, the mask pattern of the semiconductor integrated circuit is formed by arranging the macrocells and wiring signal lines between the arranged macrocells.

To confirm in advance that the semiconductor integrated circuit can be manufactured properly by the designed mask pattern and also that the manufactured semiconductor integrated circuit properly operates, a layout verification is performed. As an example, see Japanese Laid Open Patent Application JP-P 2003-36285A which is referred to as the document D1 in the following description. This document discloses a technology related to an apparatus and a method for verifying a mask layout pattern.

FIG. 1 is a block diagram showing the configuration of the mask layout pattern verification device described in the document 1. Referring to FIG. 1, the layout verification device 110 has: an input unit 101 through which a layout pattern data file and a verification command file are inputted; a layout pattern data file storage unit 102 which stores the layout pattern data file; a verification command file storage unit 103 which stores the verification command file; an interconnection and device recognition unit 104 which, in accordance with data stored in the verification command file, recognizes interconnection and a device pattern included in the layout pattern data file; a rectangle direction and center data extraction unit 105 which extracts the direction and center coordinates data from the figure of a fuse recognized by the interconnection and device recognition unit 104; and a fuse center and direction data storage unit 106 which stores the extracted direction and center coordinates of the fuse rectangle data.

The layout verification device 110 further has: a fuse center coordinates and direction calculation formula definition file storage unit 107 which stores a fuse center coordinate and direction calculation formula definition file (hereinafter referred to as TPL definition formula file) in which the formulas for calculating the fuse coordinates are defined; a virtual fuse calculation unit 108 which calculates virtual fuse center coordinate and direction data of a verification target in accordance with the calculation formulas, constants, variables, and the like defined in the TPL file; a virtual fuse center coordinate and direction data storage unit 109 which stores calculated virtual fuse center coordinate and direction data; a fuse center coordinate and direction comparison unit 111 which compares, for a fuse as a verification target, fuse center coordinate and direction data with the virtual fuse center coordinate and direction data to determine whether or not they coincide with each other; and an output unit 112 which, based on a result of comparison performed by the fuse center coordinate and direction comparison unit 111, outputs fuse center coordinate and direction in coincided or not coincided.

FIG. 2 is an explanatory diagram showing a detailed example in which center coordinates and a long side direction are extracted from rectangle data in a conventional mask layout pattern verification device. Referring to FIG. 2, the conventional mask layout pattern verification device gets coordinates P1 (1, 1), P2 (3, 1), P3 (1, 5), and P4 (3, 5) of four vertexes of rectangle data 113 (P1 to P4), and based on these coordinates, acquires center coordinates (2, 3) and direction information, i.e., long side direction (in this example, Y-axis direction), of the rectangle data.

As described above, the conventional mask layout pattern verification device extracts center coordinates and direction information for each pattern included in a layout pattern data file, compares these extracted center coordinates and direction information with virtual fuse center coordinate and direction data serving as references, and determines the directional property of each layout pattern.

In other words, the document D1 discloses a technology by which, in a mask layout pattern verification method of a semiconductor integrated circuit, the number of vertexes and the long side of verification target data are examined to thereby select predetermined rectangle data, then coordinates of four vertexes of the selected rectangle data are extracted, and a long side direction and center coordinates of the rectangle data are calculated. Further disclosed is a technology of comparing the calculated long side direction with a direction of the reference data previously specified based on a predetermined definition formula and then determining whether or not there is coincidence in the directional property of the rectangle data.

SUMMARY OF THE INVENTION

With the proceedings of the development of finer semiconductor manufacturing technology and a more complicated semiconductor device to be designed, there has been a growing demand for a technology of verifying a layout pattern generated from layout design with even higher accuracy. For example, as in mirror processing in which a certain macrocell and another macrocell are reversely laid out, those considered in the same direction in the conventional mask layout pattern verification device described above, are required to be discriminated in some cases. Moreover, there have been increasing needs for a technology of discriminating those in the same long side direction but at different arrangement angles, such as an alignment mark or the like, for recognition.

FIGS. 3A and 3B are layout diagrams showing layout of macrocells whose inner configuration is asymmetric to any symmetric axis of a cell frame. External coordinate axes 200 shown in FIGS. 3A and 3B define an arrangement direction (hereinafter referred to as "external coordinate system") of the macrocells with respect to, as a reference, a substrate on which the macrocell is arranged. The coordinate axes indicated inside the macrocell frames shown in FIGS. 3A and 3B define, for the respective macrocells, a direction (hereinafter referred to as "internal coordinate system") of a pattern inside the cell.

FIG. 3A shows the layout of the macrocell 201 in a case where the +Y direction of the external coordinates and the +y direction of the internal coordinates are equal to each other and the +X direction of the external coordinates and the +x direction of the internal coordinates are equal to each other. FIG. 3B shows the layout of the macrocell 201 in a case where the +Y direction of the external coordinates and the −y direction of the internal coordinates are equal to each other and the +X direction of the external coordinates and the +x direction of the internal coordinates are equal to each other.

Referring to FIGS. 3A and 3B, each of the macrocells 201 has a first side 202 and a second side 203 opposing the first side 202. As shown in FIGS. 3A and 3B, internal data 204 included in the macrocell 201 is so configured as to be apart from the first side 202 of the cell frame by a first interval d1 and apart from the second side 203 thereof by a second interval d2. As shown in FIGS. 3A and 3B, in the macrocell 201, the first interval d1 is not equal to the second interval d2.

Here, in the layout condition shown in FIG. 3A, the +X direction of the external coordinate axes and the long side direction of the macrocell 201 coincide with each other. Moreover, in the layout condition shown in FIG. 3 B, the +X direction of the external coordinate axes and the long side direction of the macrocell 201 also coincide with each other. Then, since the macrocell 201 is rectangle data, a length l1 is equal to a length l3.

Thus, the conventional layout pattern verification apparatus recognizes FIGS. 3A and 3B without discriminating them. As shown in FIGS. 3A and 3B, the internal data 204 of the macrocells 201 is so configured as to be reversed with respect to a particular axis. Following the recent technology trend toward finer semiconductor processes, there has been a growing demand for a technology capable of discriminating macrocells so arranged as to be reversed in this manner in recognition.

FIG. 4 is a layout diagram showing a plurality of macrocells arranged in different directions. Referring to FIG. 4, a first pattern arrangement 301 indicates the layout of the macrocell arranged in the same direction as that of a reference pattern 300 provided as a reference. A second pattern arrangement 302 indicates the layout of the reference pattern 300 arranged reversely to the reference pattern 300. A third pattern arrangement 303 indicates the layout condition of the reference pattern 300 anticlockwisely turned through 90 degrees, and a fourth pattern arrangement 304 indicates the layout condition of the reference pattern 300 anticlockwisely turned through 270 degrees. As shown in FIG. 4, the conventional mask layout pattern verification device can discriminate the third pattern arrangement 303 and the second pattern arrangement 302 into different layout conditions, but has, in some cases, difficulty in discriminating between the arranged cells, such as between the second pattern arrangement 302 and the first pattern arrangement 301, between the fourth pattern arrangement 304 and the third pattern arrangement 303.

As described above, following the advancement in the semiconductor technology, the structure of a semiconductor device has been increasingly complicated and the finer processing has also been required. A design method using a macrocell is adopted to such a semiconductor device, and a layout patterns are generated by arranging those macrocells. In a layout verification process at a design stage, the layout verification is performed through verification whether or not these macrocells are adequately arranged.

The object of the present invention is to achieve the technology which enables the enhancement of the verification of layout pattern.

To achieve the object, as an aspect of the present invention, a semiconductor design support apparatus includes: a pattern data generation unit; a layout execution unit; and a layout verification unit. The pattern data generation unit generates a pattern data of a recognition pattern. The recognition pattern is arranged in a region symmetric to both of a first axis and a second axis. The first axis and the second axis are orthogonal to each other. The recognition pattern is formed to be asymmetric to both of the first and second axes. The layout execution unit determines a layout of a macrocell in which the recognition pattern is arranged to generate layout pattern data. The layout verification unit reads out the pattern data of the recognition pattern arranged in the macrocell based on the layout pattern data to verify an arrangement direction of the macrocell based on the recognition pattern indicated in the read out pattern data.

Providing the recognition pattern which is asymmetric to two axes orthogonal to each other and executing the layout verification by using the recognition pattern make it possible to recognize the arrangement (including the direction) of a macrocell, even if the macrocell is arranged in rotated or reversed posture with respect to a specified reference arrangement condition.

In the above mentioned layout pattern verification apparatus, the layout verification unit preferably holds data of pattern obtained by predetermined figure calculation processing to the recognition pattern included in the macrocell which is arranged in an arbitral direction as verification data. Preferably the layout pattern verification apparatus has the function to verify the arrangement direction of the macrocell based on the verification data and the verification target pattern, the verification target pattern being obtained by executing the predetermined calculation processing to the recognition pattern indicated by the pattern data read from the layout pattern data.

According to the present invention, layout pattern verification can be performed with higher accuracy. Especially when cells having the same internal configuration are arranged by turning or reversing, their arrangement can be discriminated from each other for recognition.

BRIEF DESCRIPTION OF THE DRAWINGS

FIG. 4 is a layout diagram showing the layout of macrocells arranged in different directions;

FIG. 5 is a block diagram illustrating the configuration of a layout verification device of an embodiment of the present invention;

FIG. 11 is a table illustrating the configuration of resizing requirement data 23;

FIG. 12 is a table illustrating the configuration of verification data 25;

FIG. 17 is a table illustrating the configuration of resizing requirement data 23 in the second embodiment;

FIG. 22 is a table illustrating the configuration of resizing requirement data 23 in the third embodiment;

FIG. 23 is a table illustrating the configuration of verification data 25 in the third embodiment;

DESCRIPTION OF THE PREFERRED EMBODIMENTS

Figure 1:
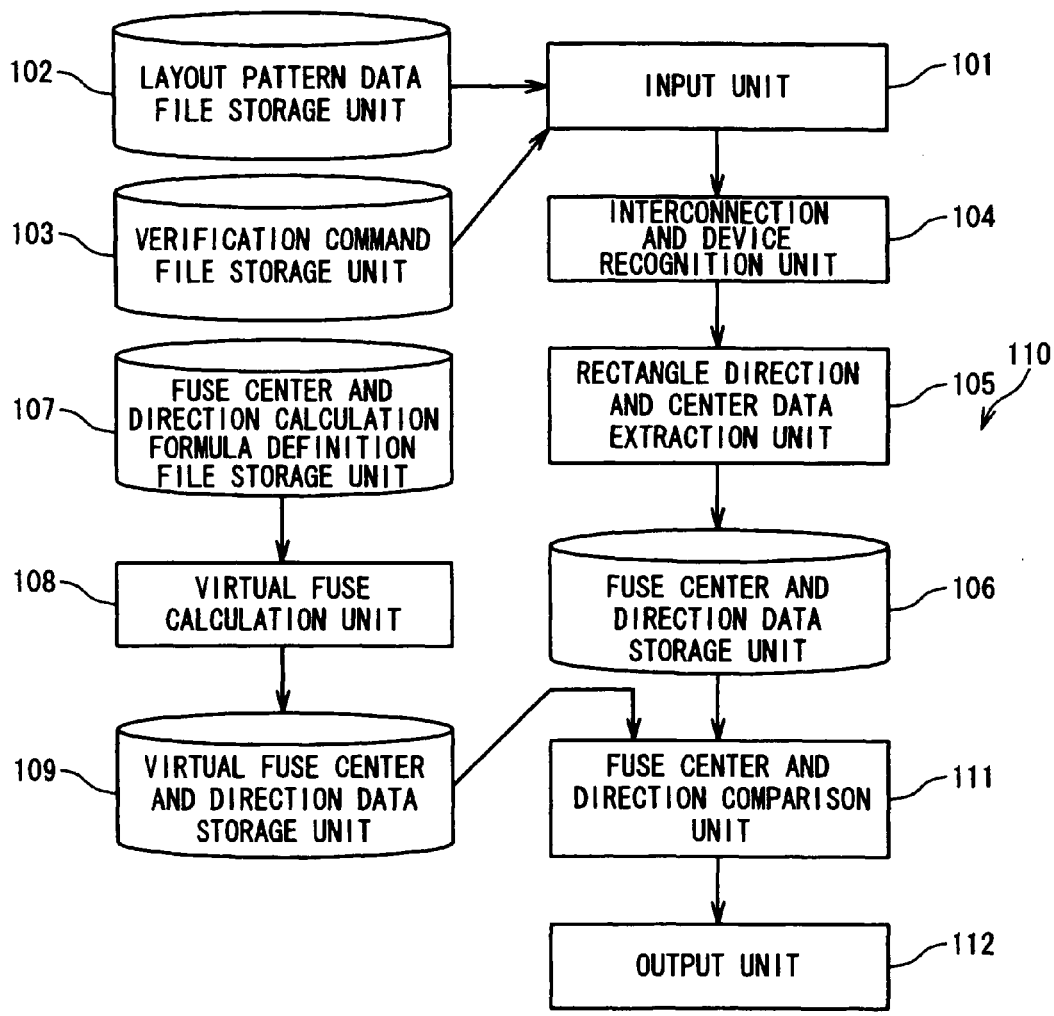
FIG. 1 is a block diagram showing the configuration of a conventional mask layout pattern verification device.
Figure 2:
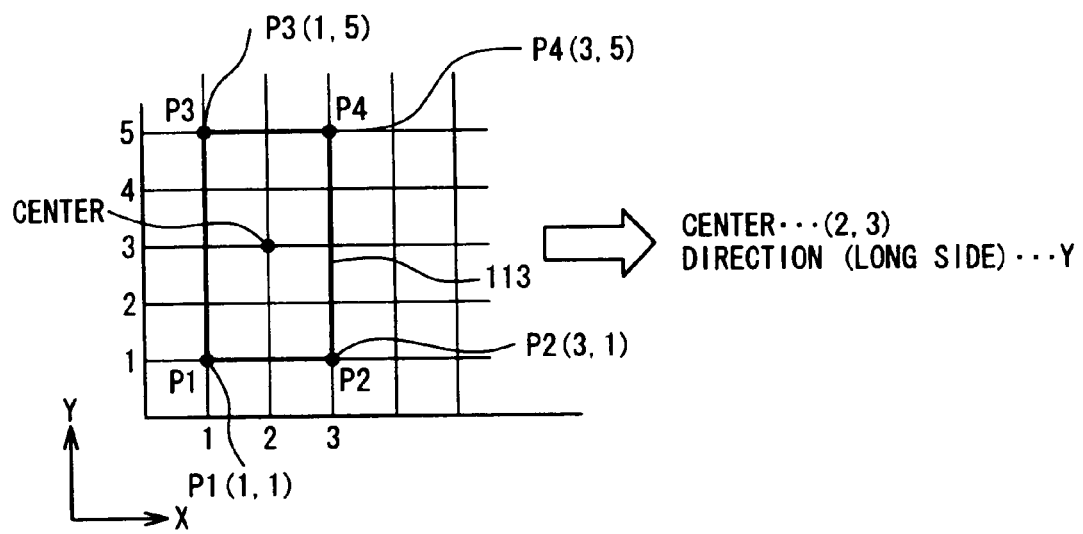
FIG. 2 is a explanatory diagram showing an example in which center coordinates and a long side direction are extracted from rectangle data in the conventional mask layout pattern verification device.
Figure 3A:
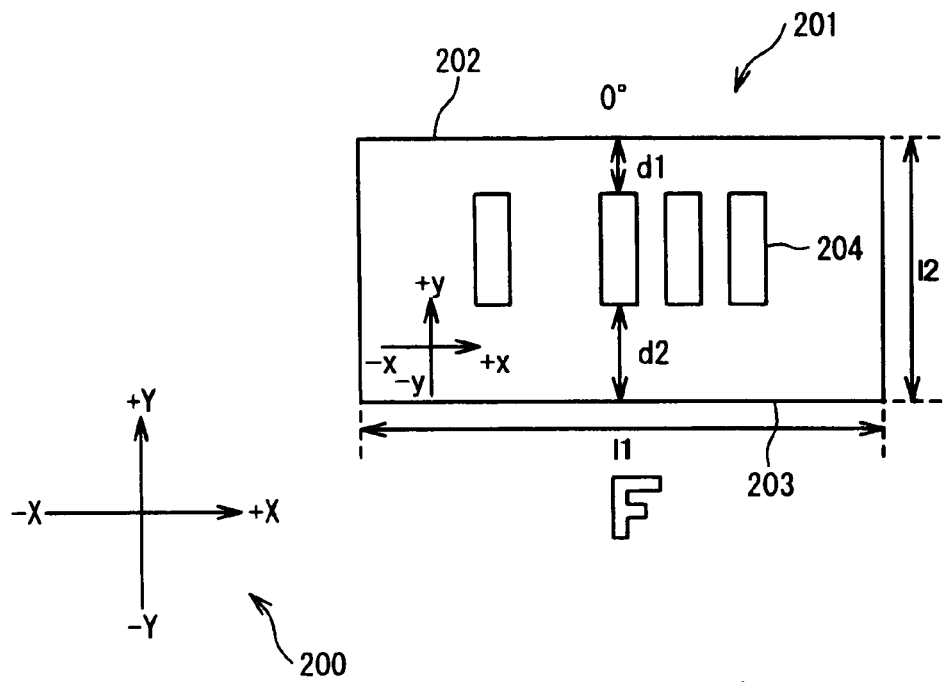
FIGS. 3A and 3B are layout diagrams showing the layout of a conventional macrocell.
Figure 3B:
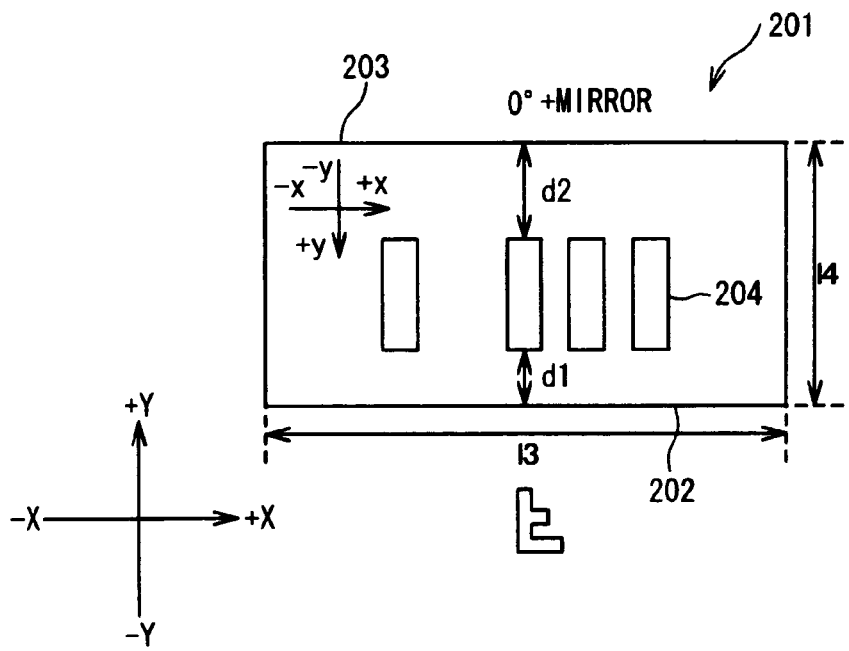

Hereinafter, embodiments of the present invention will be described referring to the accompanying drawings.

First Embodiment

FIG. 5 is a block diagram illustrating the configuration of a layout pattern verification device 10 of the present embodiment. The layout pattern verification device 10 of the present embodiment is configured to include: an information processing device 1, an input device 2; and an output device 3. Referring to FIG. 5, the information processing device 1 is provided with: a CPU (Central Processing Unit) 4; a memory 5; an input and output interface 6; and a mass storage device 7, which are connected together via a bus 8. The mass storage device 7 is configured to include a data storage section 11 and a program storage section 12.

The information processing device 1 is a high speed processing unit realized by various kinds of computer systems represented by a personal computer, a workstation, and the like. The input device 2 is a man-machine interface provided with a function of inputting data to the information processing device 1, and can be realized by various kinds of devices represented by, for example, a keyboard, a mouse, and the like. The embodiment below will be described, illustrating a case where the input device 2 is a keyboard. The output device 3 is a man-machine interface having a function of outputting, to the outside, a result of processing performed by the information processing device 1, and can be realized by various kinds of devices represented by, for example, a CRT and a liquid crystal display. The embodiment below will be described, illustrating a case where the output device 3 is a display device which visually displays a layout verification result and other information.

The CPU 4 is a processing unit which performs control of various devices provided in the layout pattern verification device 10 and performs processing on data inputted to and outputted from the information processing device 1. The CPU 4 interprets data received from the input device 2 or the like to perform calculation, and then outputs a result of this calculation to the output device 3 or the like. The memory 5 is a recording medium which permits data writing and reading thereon, and is exemplified by the SDRAM, the DDR-SDRAM. The input and output interface 6 is a device which controls data communication performed between each one of the input device 2 and output device 3 described above and the information processing device 1. The mass storage device 7 is a device used for recording a large volume of data on the recording medium, and is exemplified by the HDD (Hard Disk Drive). As shown in FIG. 5, the mass storage device 7 is configured to include the program storage section 12 and the data storage section 11.

The data storage section 11 is a memory area which stores, of various data held in the mass storage device 7, data related to the present embodiment. Similarly, the program storage section 12 is a memory area which stores, of the various data held in the mass storage device 7, a computer program related to the operations of the present embodiment. Hereinafter, referring to the drawings, the configuration of the program storage section 12 and the data storage section 11 will be described in detail.

Figure 6:
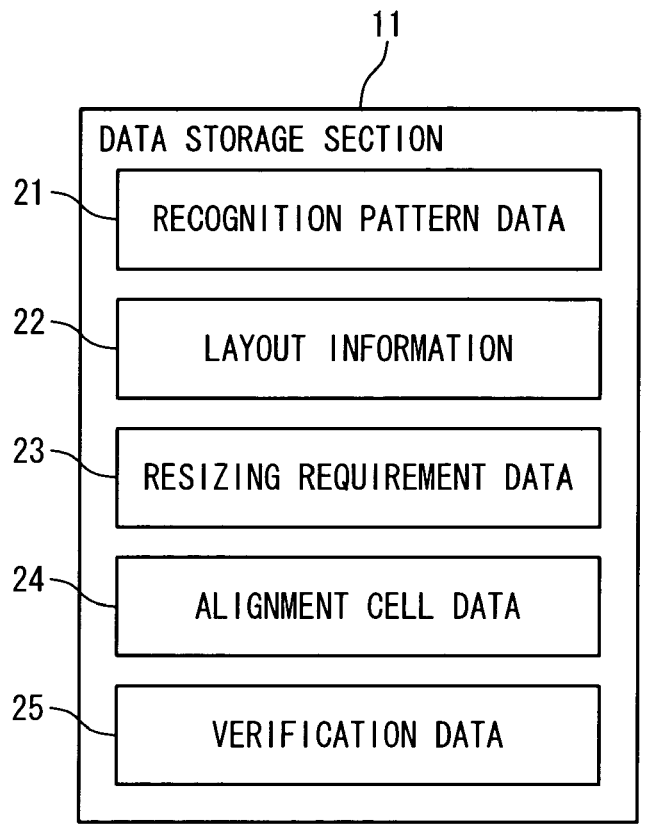
FIG. 6 is a block diagram illustrating the configuration of a data storage section 11.

FIG. 6 is a block diagram illustrating the configuration of the data storage section 11. Referring to FIG. 6, the data storage section 11 is configured to store: recognition pattern data 21, layout information 22, resizing requirement data 23, alignment cell data 24, and verification data 25. The recognition pattern data 21 is data indicating information of a pattern used for the layout verification. The layout information 22 is information related to the layout of a pattern formed on the substrate. The resizing requirement data 23 is information related to figure calculation processing executed on the recognition pattern described above in a layout verification operation to be described later. The alignment cell data 24 is cell data provided with a recognition pattern. The embodiment below will be described, illustrating a case where a recognition pattern is provided in this alignment cell data 24, although this does not limit the macrocell provided with a recognition pattern to a specific macrocell in the present invention. The verification data 25 is information used in the layout verification to be described later for judging whether or not the layout of a pattern arranged is proper.

Figure 7:
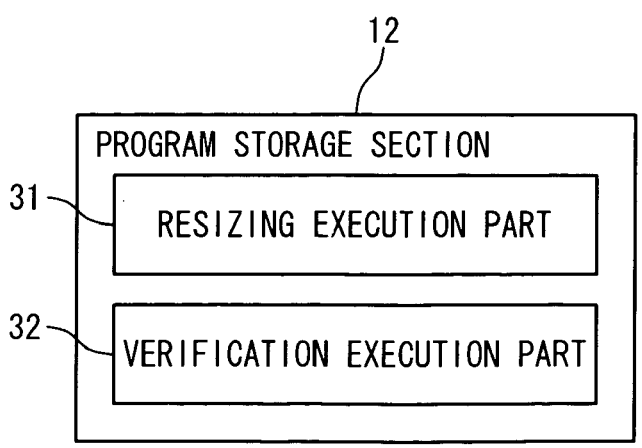
FIG. 7 is a block diagram illustrating the configuration of a program storage section 12.

FIG. 7 is a block diagram illustrating the configuration of the program storage section 12. Referring to FIG. 7, the program storage section 12 is configured to include a resizing execution part 31 and a verification execution part 32. The resizing execution part 31 is a program indicating procedures for performing figure (or graphic form) calculation processing on the recognition pattern described above (hereinafter, "resize" is used as a synonymous word with "figure calculation processing") when the layout verification is executed. The verification execution part 32 is a program indicating procedures for performing the layout verification in correspondence with the processing of the resizing execution part described above.

Figure 8:
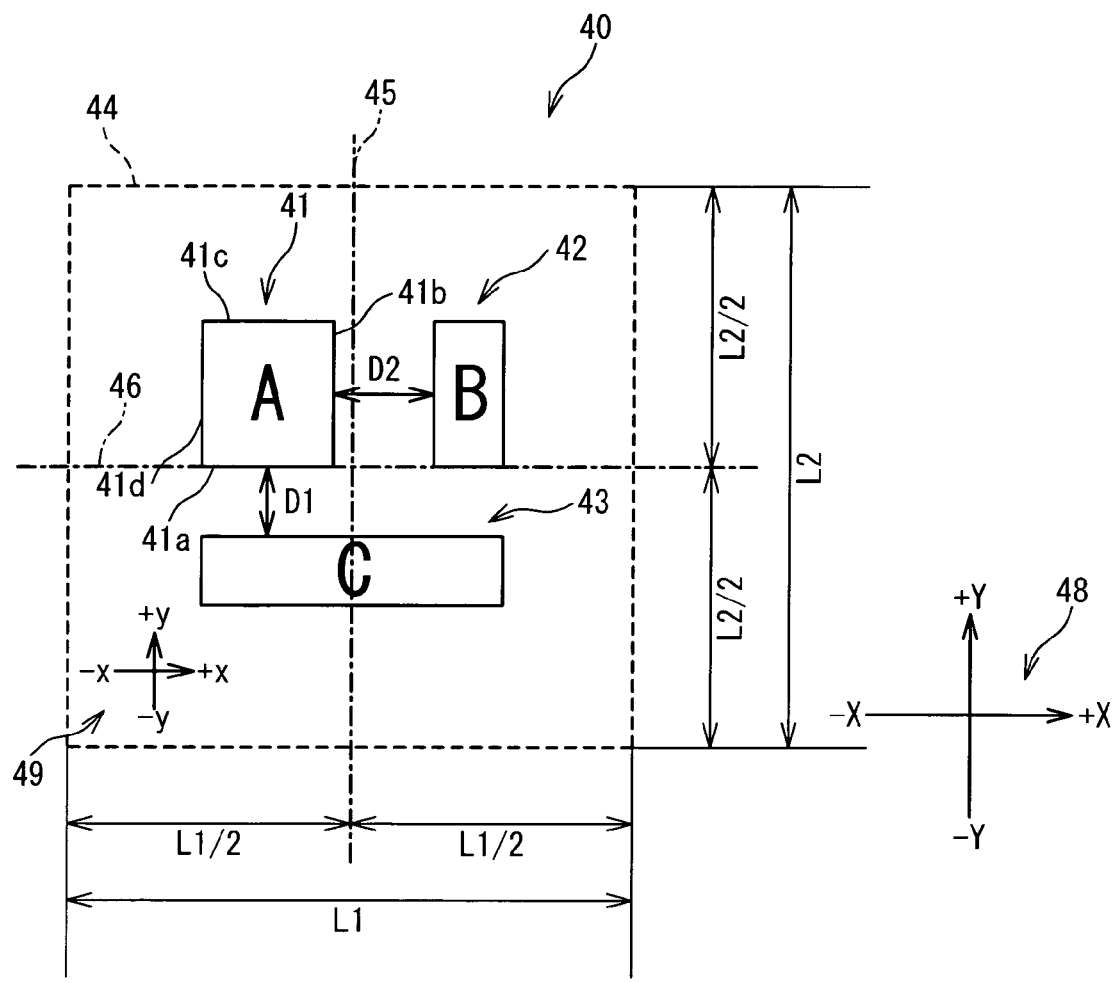
FIG. 8 is a pattern diagram showing a layout pattern of a recognition pattern 40 based on recognition pattern data 21.

FIG. 8 is a layout diagram illustrating the configuration of a recognition pattern 40 corresponding to the recognition pattern data 21 in the first embodiment. Referring to FIG. 8, the recognition pattern 40 in the first embodiment is configured to include a first pattern 41, a second pattern 42, and a third pattern 43. When the first pattern 41, the second pattern 42, and the third pattern 43 are projected in the direction normal to the substrate, they are neither overlapped nor contacted to each other. Every pattern (including 41, 42, and 43) is arranged in a region 44. Here, the first pattern 41, the second pattern 42, and the third pattern 43 are preferably patterns which are recognized independently of the other two.

As shown in FIG. 8, the region 44 is formed of an axisymmetric figure having as symmetric axes a first symmetric axis 45 and a second symmetric axis 46 orthogonal to the first symmetric axis 45. In the first embodiment, the patterns (the first pattern 41, the second pattern 42, and the third pattern 43) arranged in the region 44 are so arranged as to be asymmetric to the first symmetric axis 45 and the second symmetric axis 46. In the following explanation of the first embodiment, illustrating a case where the first pattern 41, the second pattern 42, and the third pattern 43 are each formed of rectangular form pattern for easier understanding of the present invention. Note that this does not mean that the recognition pattern 40 in the present invention is limited to a combination of rectangular patterns.

Internal coordinate axes 49 shown in FIG. 8 define the positional relationship of the patterns forming the recognition pattern 40. External coordinate axes 48 define the arrangement direction of macrocells with respect to the substrate as a reference. In the arrangement shown in FIG. 8, the third pattern 43 and the first pattern 41 are formed to be apart from each other by an interval of a first distance D1, and the second pattern 42 and the first pattern 41 are formed to be apart from each other by an interval of a second distance D2. The second pattern 42 is arranged in the +x direction defined by the internal coordinate axes 49 with respect to the first pattern 41 as a reference. The third pattern 43 is arranged in the −y direction defined by the internal coordinate axes 49 with respect to the first pattern 41 as a reference.

The first pattern 41 includes four sides (a first pattern first side 41a, a first pattern second side 41b, a first pattern third side 41c, and a first pattern fourth side 41d). In the embodiments to be described below, the side in the −Y direction of the external coordinate axes 48 is defined as the first pattern first side 41a, the side in the +X direction thereof is defined as the first pattern second side 41b, the side in the +Y direction thereof is defined as the first pattern third side 41c, and the side in the −X direction thereof is defined as the first pattern fourth side 41d. Therefore, in the layout condition shown in FIG. 8, the third pattern 43 is arranged at an interval of the first distance D1 from the first pattern first side 41a, and the second pattern 42 is arranged at an interval of the second distance D2 from the first pattern second side 41b.

Figure 9A:
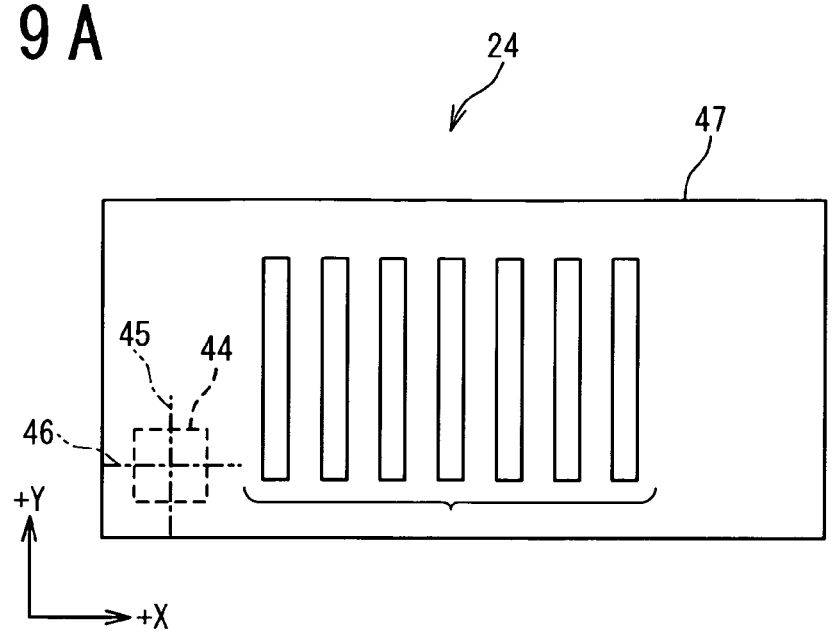
FIGS. 9A and 9B are layout pattern diagrams when alignment cell data 24 including the recognition pattern 40 is arranged.
Figure 9B:
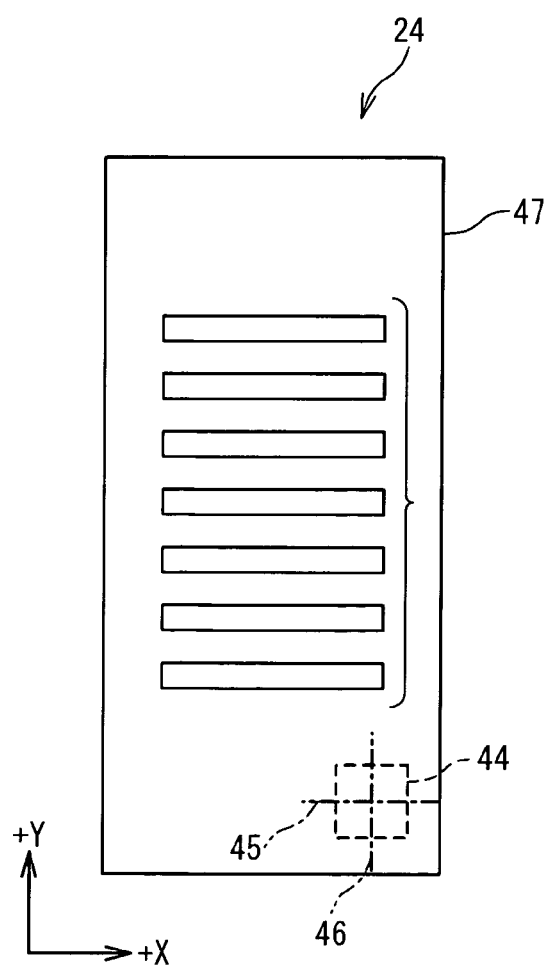

Hereinafter, a description will be given, referring to a case where the alignment cell data 24 including the recognition pattern 40 is arranged on the substrate in different layout. FIGS. 9A and 9B are layout pattern diagrams in which the alignment cell data 24 is arranged. The region 44 of the recognition pattern 40 which is included in the area of the alignment cell data 24 is also drawn. FIG. 9A shows a layout pattern in a case where the recognition pattern 40 is arranged in the alignment cell data 24 formed of rectangular patterns and the long side direction of a cell frame 47 of the alignment cell data 24 is same to the +X direction of the external coordinate axes 48. FIG. 9B shows a layout pattern in a case where the long side direction of the cell frame 47 of this alignment cell data 24 is same to the +Y direction of the external coordinate axes 48.

As shown in FIGS. 9A and 9B, in the condition of FIG. 9A, the region 44 is arranged so that the first symmetric axis 45 and the +Y direction are parallel with each other and also so that the second symmetric axis 46 and the +X direction are parallel with each other. The condition of FIG. 9B is a condition in which the layout pattern shown in FIG. 9A is so arranged as to be anticlockwisely turned through 90 degrees. The alignment cell data 24 is configured to incorporate the recognition pattern 40 in a certain fixed relative direction, before its layout is executed. Therefore, as shown in FIG. 9B, in this condition, the region 44 is arranged so that the second symmetric axis 46 and the +Y direction are parallel with each other and also that the first symmetric axis 45 and the +X direction are parallel with each other.

As described above, the recognition pattern 40 arranged in the region 44 is formed of the plurality of patterns (41, 42, and 43) arranged asymmetrically to the first symmetric axis 45 and the second symmetric axis 46. Thus, in the layout patterns as shown in FIG. 9A and FIG. 9B, by verifying the posture of the recognition pattern 40 in the region 44 automatically, the layout (especially the direction relative to the external coordinate axes) of the alignment cell data 24 can be automatically verified.

When macrocells having a predetermined circuit are to be arranged on the substrate, even if these macrocells have the same internal circuit configuration, due to restrictions caused by the wiring arrangement or the like, they may be arranged in a posture (hereinafter, referred to as arrangement angle) of being turned or reversed with respect to a particular arrangement direction as a reference. Even when their arrangement angles are different, there is a case that their circuit configurations itself have not been changed and thus judged to be the same circuits in operation verification. As described above, when the macrocells are determined to be the same in operation, discriminating their arrangement angles for recognition makes it possible to improve the accuracy in the layout verification.

In the present embodiment, the configuration of the recognition pattern 40 is not limited to the arrangement shown in FIG. 8. FIGS. 10A to 10H are layout pattern diagrams illustrating the patterns (41, 42, and 43) forming the recognition pattern 40. Hereinafter, a description will be given, assuming that FIGS. 10A to 10H are a first to an eighth conditions, respectively.

Figure 10A:
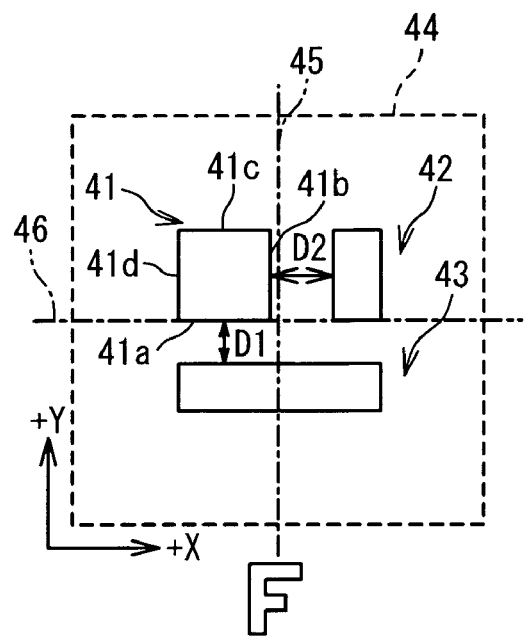
FIGS. 10A to 10H are layout pattern diagrams illustrating a plurality of patterns forming the recognition pattern 40.

Referring to FIG. 10A, the recognition pattern 40 in the first condition is formed of the first pattern 41, the second pattern 42 arranged in the +X direction of external coordinate axes 48 with respect to the first pattern 41, and the third pattern 43 arranged in the −Y direction thereof with respect to the first pattern 41. In the first condition, an interval of a first distance D1 is provided between the first pattern first side 41a of the first pattern 41 and the third pattern 43, and an interval of a second distance D2 is provided between the first pattern second side 41b thereof and the second pattern 42.

Figure 10B:
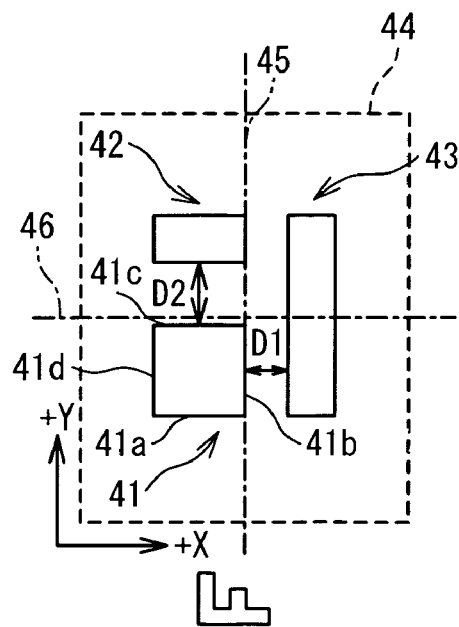

Referring to FIG. 10B, the recognition pattern 40 in the second condition is in the same arrangement condition as an arrangement condition when the recognition pattern 40 in the first condition is so arranged as to be turned anticlockwisely through 90 degrees. In the second condition, for sides of the first pattern 41, as shown in FIG. 10B, the side in the −Y direction of external coordinate axes 48 is defined as the first pattern first side 41a, the side in the +X direction thereof is defined as the first pattern second side 41b, the side in the +Y direction thereof is defined as the first pattern third side 41c, and the side in the −X direction thereof is defined as the first pattern fourth side 41*d*. A symmetric axis parallel with the ±Y directions of the external coordinate axes 48 is defined as a first symmetric axis 45, and a symmetric axis parallel with the ±X directions of the external coordinate axes 48 is defined as a second symmetric axis 46.

Figure 10C:
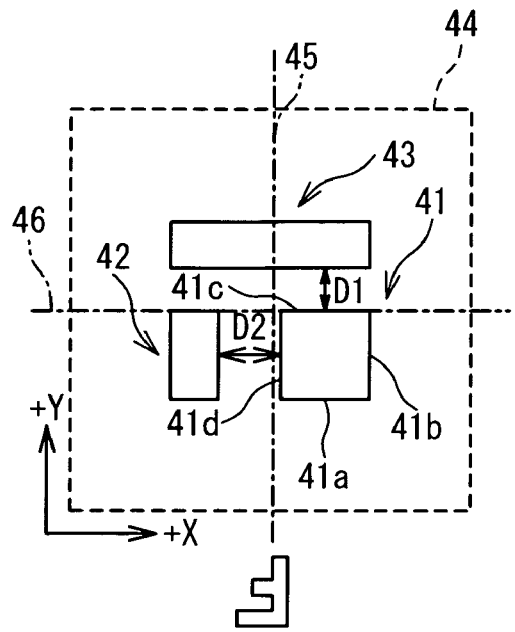
Figure 10D:
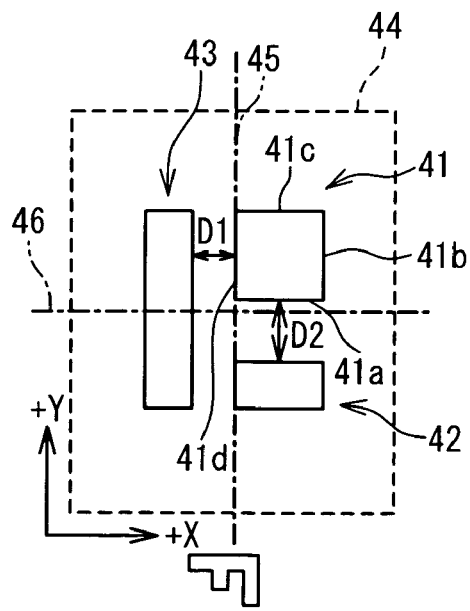

Similarly, FIG. 10C illustrates the arrangement condition of the recognition pattern 40 in the third condition, and FIG. 10D illustrates the arrangement condition of the recognition pattern 40 in the fourth condition. The recognition pattern 40 in the third condition is in the same arrangement condition as an arrangement condition when the recognition pattern 40 in the first condition is so arranged as to be turned through 180 degrees, and the recognition pattern 40 in the fourth condition is in the same arrangement condition as an arrangement condition when the recognition pattern 40 in the second condition is so arranged as to be turned through 180 degrees. In both the third and fourth conditions, the side in the −Y direction of the external coordinate axes 48 is defined as the first pattern first side 41*a*, the side in the +X direction thereof is defined as the first pattern second side 41*b*, the side in the +Y direction thereof is defined as the first pattern third side 41*c*, and the side in the −X direction thereof is defined as the first pattern fourth side 41*d*. A symmetric axis parallel with the ±Y directions of the external coordinate axes 48 is defined as the first symmetric axis 45, and a symmetric axis parallel with the ±X directions of the external coordinate axes 48 is defined as the second symmetric axis 46.

Figure 10E:
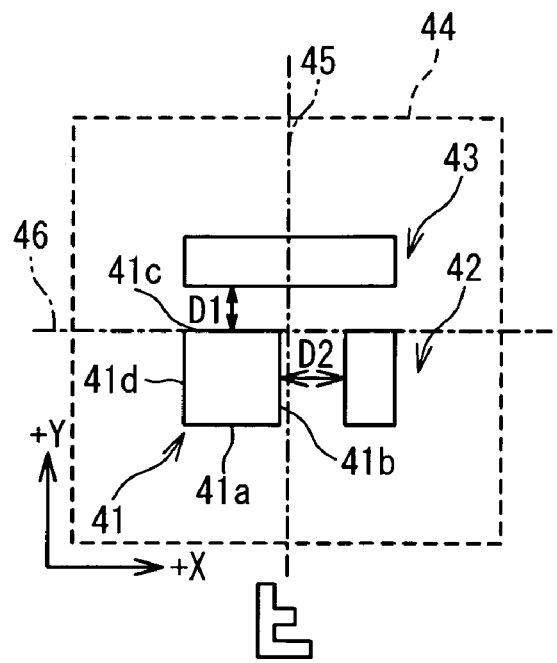

Referring to FIG. 10E, the recognition pattern 40 in the fifth condition is in the same arrangement condition as an arrangement condition when the recognition pattern 40 in the first condition is so arranged as to be reversed through 180 degrees with respect to the second symmetric axis 46. In the fifth condition, for sides of the first pattern 41, as shown in FIG. 10E, the side in the −Y direction of external coordinate axes 48 is defined as the first pattern first side 41*a*, the side in the +X direction thereof is defined as the first pattern second side 41*b*, the side in the +Y direction thereof is defined as the first pattern third side 41*c*, and the side in the −X direction thereof is defined as the first pattern fourth side 41*d*. A symmetric axis parallel with the ±Y directions of the external coordinate axes 48 is defined as the first symmetric axis 45, and a symmetric axis parallel with the ±X directions of the external coordinate axes 48 is defined as the second symmetric axis 46.

Figure 10F:
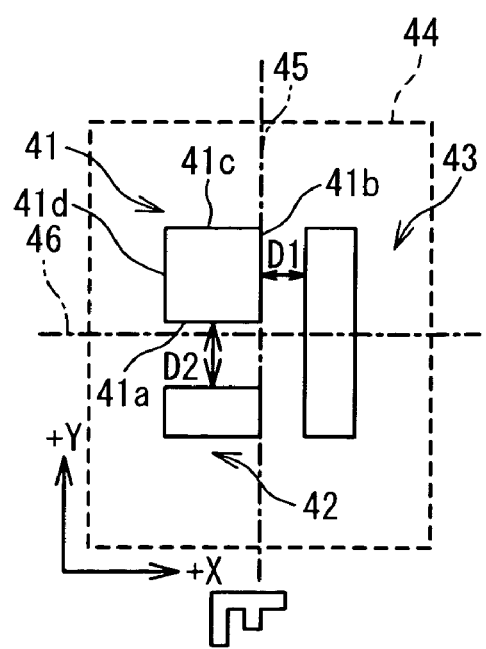
Figure 10G:
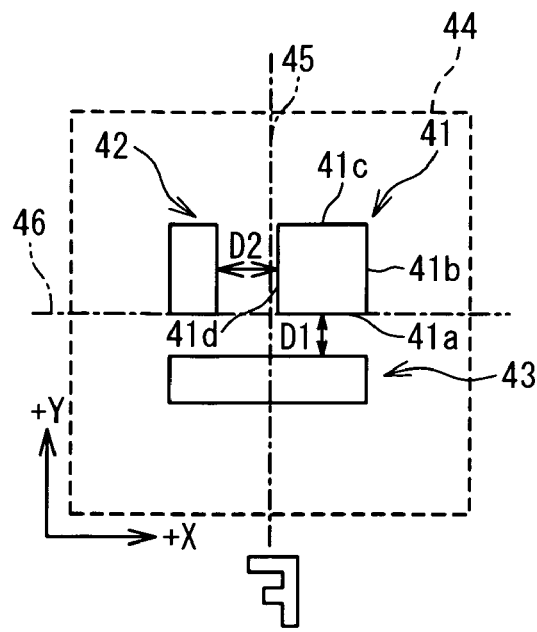
Figure 10H:
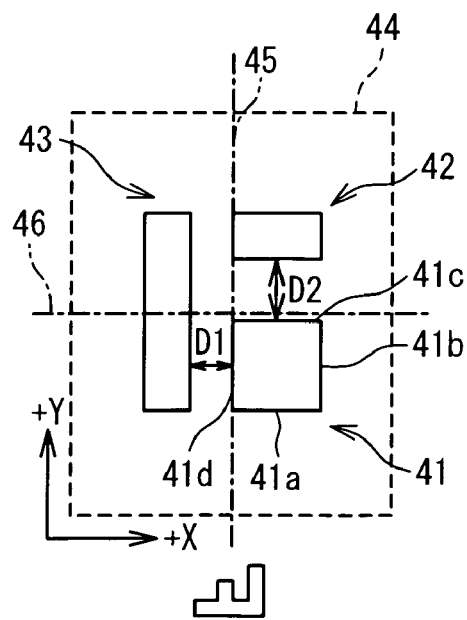

Similarly, FIGS. 10F, 10G, and 10H illustrate arrangement conditions of the recognition pattern 40 in the sixth, seventh, and eighth conditions, respectively. The recognition pattern 40 in the sixth condition is in the same arrangement condition as an arrangement condition when the recognition pattern 40 in the second condition is so arranged as to be reversed through 180 degrees with respect to the second symmetric axis 46. The recognition pattern 40 in the seventh condition is in the same arrangement condition as an arrangement condition when the recognition pattern 40 in the third condition is so arranged as to be reversed through 180 degrees with respect to the second symmetric axis 46. The recognition pattern 40 in the eighth condition is in the same arrangement as an arrangement condition when the recognition pattern 40 in the fourth condition is so arranged as to be reversed through 180 degrees with respect to the second symmetric axis 46.

In each of the sixth, seventh, and eighth conditions, for sides of the first pattern 41, the side in the −Y direction of external coordinate axes 48 is defined as the first pattern first side 41*a*, the side in the +X direction thereof is defined as the first pattern second side 41*b*, the side in the +Y direction thereof is defined as the first pattern third side 41*c*, and the side in the −X direction thereof is defined as the first pattern fourth side 41*d*. A symmetric axis parallel with the +Y directions of the external coordinate axes 48 is defined as the first symmetric axis 45, and a symmetric axis parallel with the +X directions of the external coordinate axes 48 is defined as the second symmetric axis 46.

Consequently, through the layout verification operation to be described later, the layout condition of the alignment cell data 24 can be verified based on the first to eighth conditions as references. Each of the first to eighth conditions can be provided by turning or reversing one of these conditions, when any one of the conditions is specified. Therefore, by holding at least one of the first to eighth conditions as the recognition pattern 40, the recognition patterns 40 corresponding to the respective conditions can be automatically constructed.

Hereinafter, verification data for performing the layout verification will be described in correspondence with the first to eighth conditions described above. FIG. 11 is a table illustrating the configuration of the resizing requirement data 23. Referring to FIG. 11, the resizing requirement data 23 includes data from conditions 51 to change directions 56. As shown in FIG. 11, with the conditions 51 stored in the first column of the resizing requirement data 23, the data from direction specification patterns 52 to the change directions 56 are held in correspondence with the first to eighth conditions included in the conditions 51.

The direction specification patterns 52 are pattern data indicating the arrangement angle of each of the pattern with respect to a defined reference condition. The direction specification patterns 52 are related to the conditions 51 (first to eight conditions) respectively in one-to-one correspondence. The verification requirements 53 are verification requirements corresponding to the respective conditions. The first pattern data changing target portions 54 indicate portions to be resized when the respective verification requirements are specified. The change amounts 55 indicate resizing amounts of the portions to be resized when the respective verification requirements are specified. The change directions 56 indicate the resizing directions of the portions to be resized when the respective verification requirements are specified.

FIG. 12 is a table illustrating the configuration of the verification data 25 stored in the data storage section 11. Referring to FIG. 12, the verification data 25 holds data for, based on the resizing requirement data 23 and execution results of the layout verification to be described later, specifying in which condition the recognition pattern 40 is arranged. For example, as a result of the layout verification executed based on a first condition verification requirement, the verification execution part 32 specifies, when the first pattern 41 is in contact with the second pattern 42 and the third pattern 43 after the execution of the layout verification, that the first pattern 41 is arranged in the first condition, and judges, when the first pattern 41 is in contact with only either of the second pattern 42 and the third pattern 43 or neither of them, that the recognition pattern 40 is not arranged in the first condition.

Figure 13:
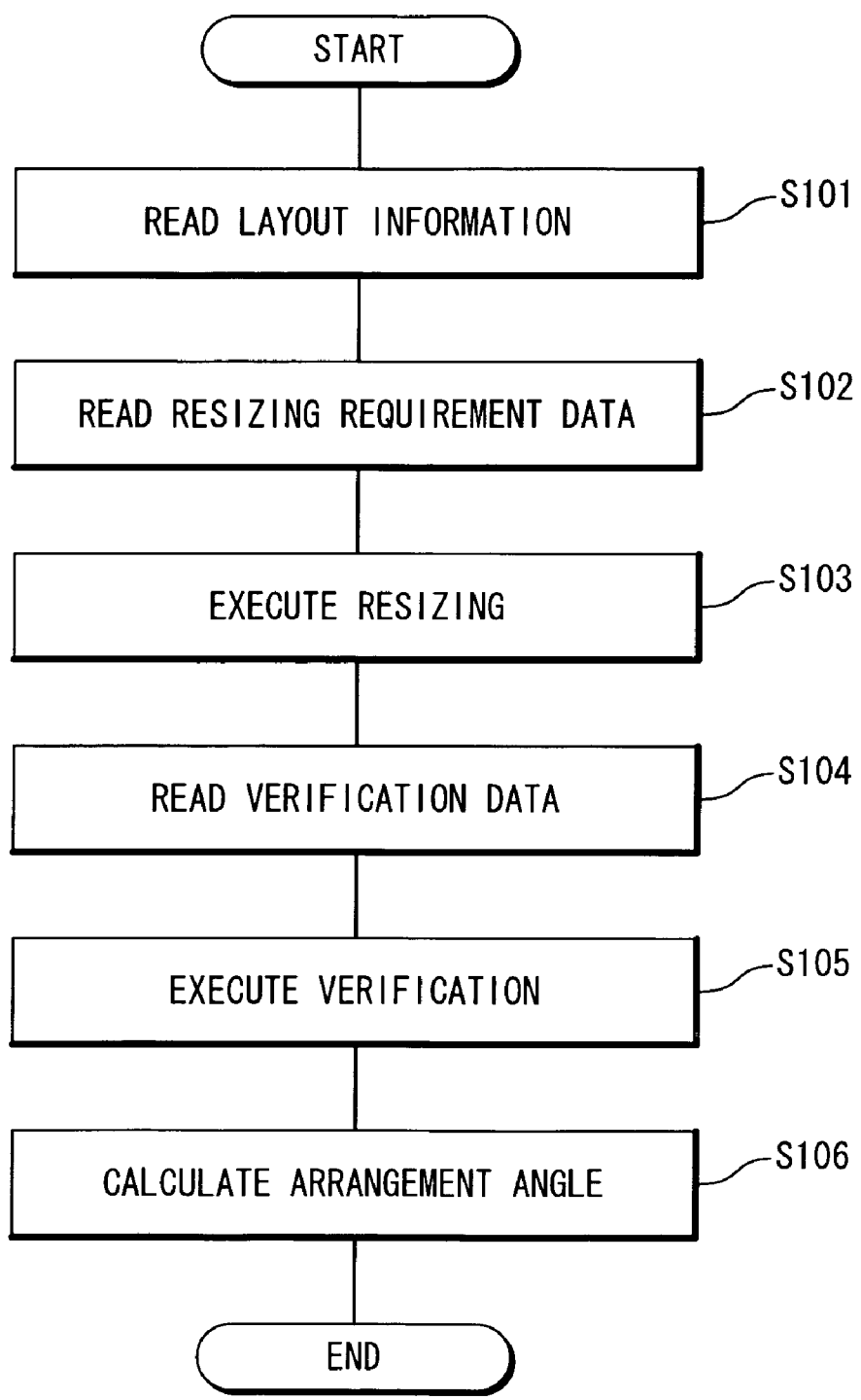
FIG. 13 is a flow chart illustrating operation in the present embodiment.

Hereinafter, referring to the drawings, the operation of the layout verification using the recognition pattern 40 of the present embodiment will be described. FIG. 13 is a flow chart illustrating the operation performed in the present embodiment. The operation shown in this flow chart starts in response to a defined command for layout verification execution. The operation to be described below is executed by the operation of the information processing device 1 based on the procedures indicated by the computer programs of the resizing execution part 31 and the verification execution part 32.

Referring to FIG. 13, in step S101, the resizing execution part 31 reads the layout information 22 from the data storage section 11 and specifies the layout pattern of a verification target. In step S102, the resizing execution part 31 reads the resizing requirement data 23 from the data storage section 11. In step S103, the resizing execution part 31, based on the layout information 22 read in step S102 and the resizing requirement data 23 read in step S103, changes the size of the first pattern 41 of the recognition pattern 40 into the specified layout pattern to generate a size changed first pattern data. As described above, it is preferable that the first pattern 41, the second pattern 42, and the third pattern 43 are patterns which are recognized independently of the other two. Thus, as a result of the size change of the first pattern 41, dependently to the arrangement condition, the first pattern 41 and the second pattern 42, or the first pattern 41 and the third pattern 43 make contact with each other. The arrangement angle of the layout pattern is verified by detecting this contact condition.

In step S104, the verification execution part 32 reads the verification data 25 from the data storage section 11. In step S105, the verification execution part 32, based on the execution result obtained in step S103, verifies whether or not the first pattern indicated by the size changed (resized) first pattern data makes contact with the second pattern 42 and the third pattern 43. In step S106, the verification execution part 32, based on the verification result obtained by this verification and refers to the read verification data 25 to find out whether or not the arrangement angle of the layout pattern specified in step S101 is proper. As a result, when cells with the same internal configuration are arranged at different arrangement angles, the layout pattern verification device 10 of the present embodiment can discriminate their different arrangement angles for recognition. Moreover, this verification can be automatically carried out. Therefore, generating a photomask based on the layout verification of the present embodiment permits reducing man-hours in manufacturing processes of semiconductor devices.

Figure 14A:
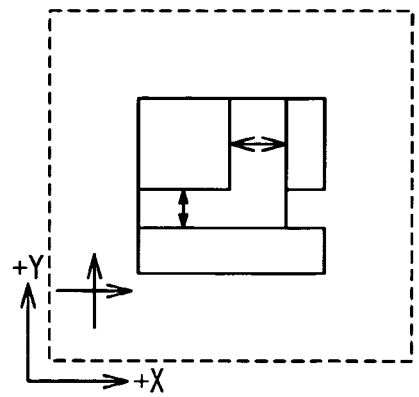
FIGS. 14A to 14H are layout pattern diagrams illustrating the transition of a layout pattern when the size of a first pattern is changed based on a first condition verification requirement.
Figure 14B:
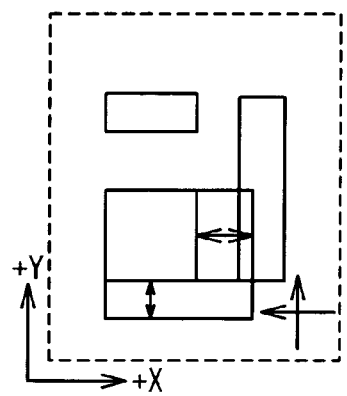
Figure 14C:
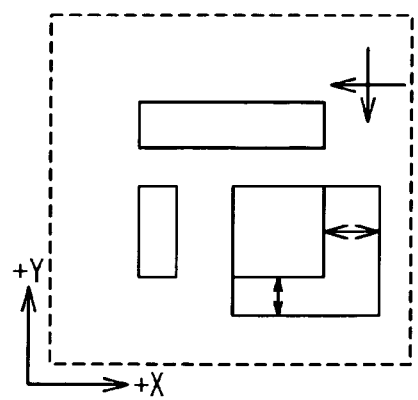
Figure 14D:
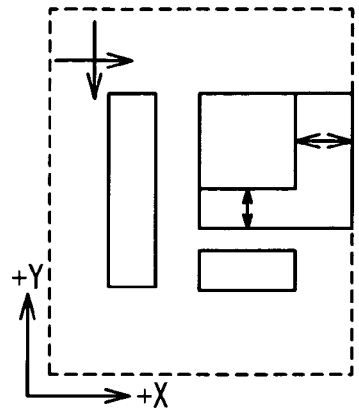
Figure 14E:
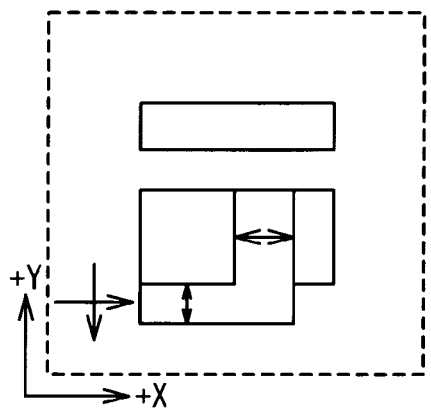
Figure 14F:
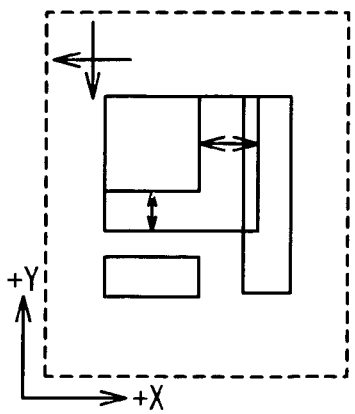
Figure 14G:
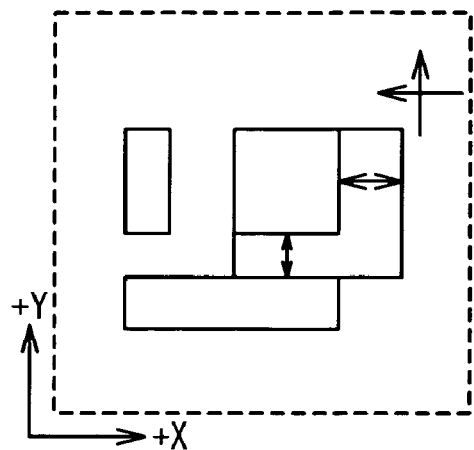
Figure 14H:
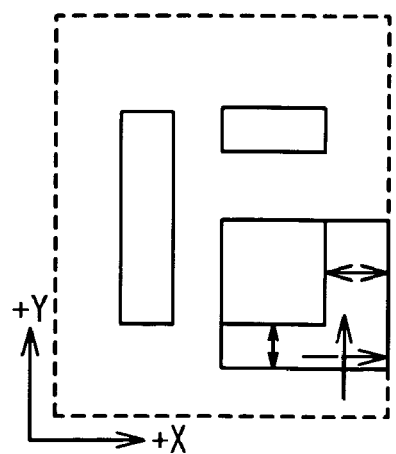
Figure 15A:
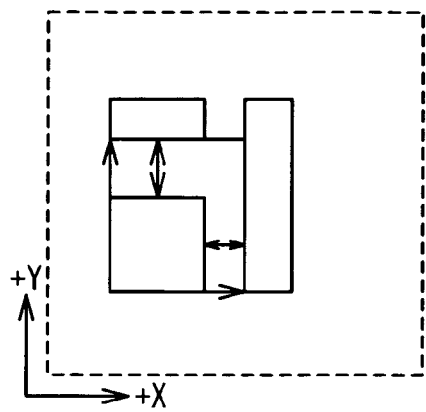
FIGS. 15A to 15H are layout pattern diagrams illustrating the transition of a layout pattern when the size of the first pattern is changed based on a second condition verification requirement.
Figure 15B:
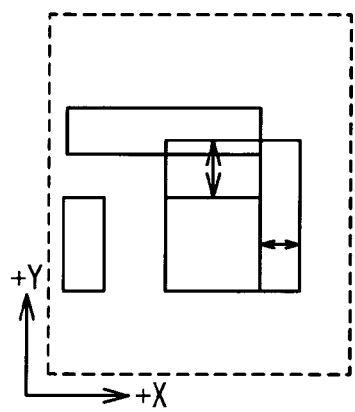
Figure 15C:
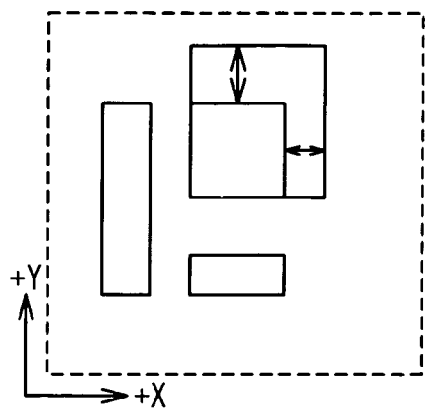
Figure 15D:
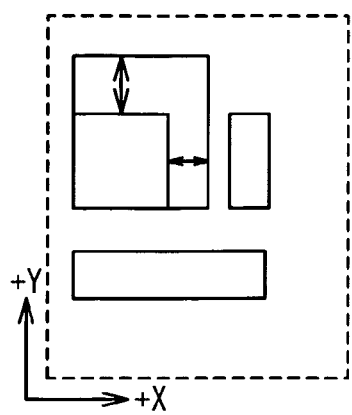
Figure 15E:
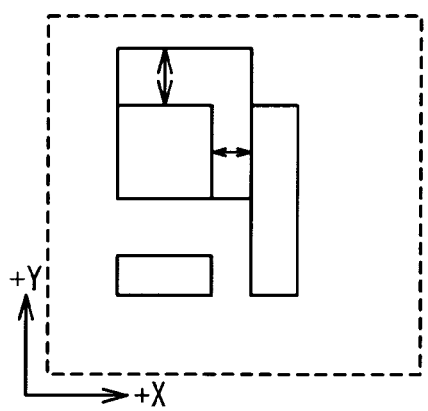
Figure 15F:
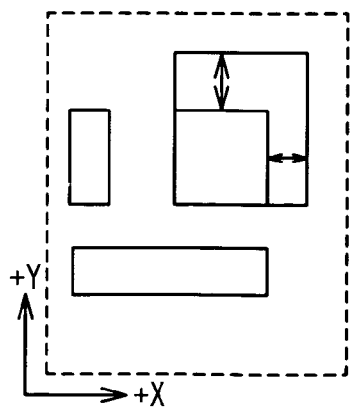
Figure 15G:
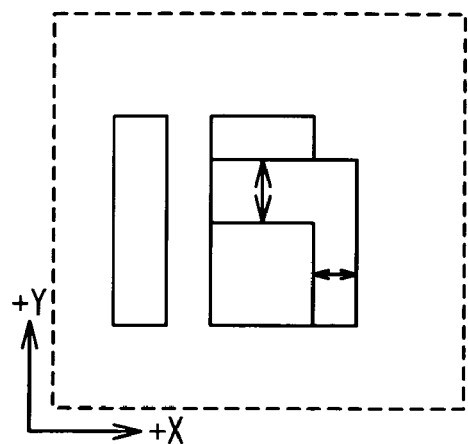
Figure 15H:
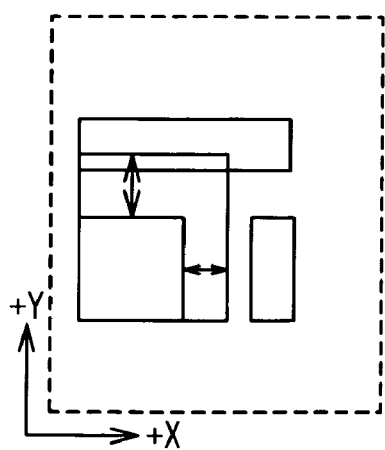

Hereinafter, operation of generating the size changed first pattern data described above will be described referring to the drawings. FIGS. 14A to 14H are layout pattern diagrams illustrating transition of layout patterns when the size of the first pattern is changed based on the first condition verification requirement with respect to the first condition as a reference. In the description below, FIG. 14A shows the layout pattern when the alignment cell data 24 having the recognition pattern 40 in the first condition is properly arranged, and FIGS. 14B to 14H show the layout patterns when the alignment cell data 24 having the recognition pattern 40 in the first condition is so arranged as to be turned or reversed for some reasons.

Referring to FIGS. 14A to 14H, the resizing execution part 31 which has read the resizing requirement data 23 from the data storage section 11, based on the first condition verification requirement of the resizing requirement data 23, specifies, from the sides forming the first pattern 41, the sides (first pattern data changing target portions 54) which are the targets of the size change. Here, the first pattern data changing target portions 54 indicated by the first condition verification requirement are the first pattern first side 41a and the first pattern second side 41b. Thus, the resizing execution part 31, for the first patterns 41 in the conditions shown in FIGS. 14A to 14H, specifies the side placed in the +X direction and the side placed in the −Y direction as the first pattern first side 41a and the first pattern second side 41b, respectively.

The resizing execution part 31 refers to the change amounts 55 of the resizing requirement data 23 to determine the change amounts for the specified sides. Moreover, the resizing execution part 31 refers to the change directions 56 of the resizing requirement data 23 to determine the change directions (the direction to which the specified side is extended through the resizing process) for the specified sides. Here, referring to the change amounts 55 indicated by the first condition verification requirement, the change amount 55 for the first pattern first side 41a is the first length (set to be equal to the first distance D1), and the change amount 55 for the first pattern second side 41b is the second length (set to be equal to the second distance D2). The change direction 56 for the first pattern first side 41a is the −Y direction, and the change direction 56 for the first pattern second side 41b is the +X direction.

The resizing execution part 31, based on these requirements, changes the size of the first pattern 41 to generate the size changed first pattern data. FIGS. 14A to 14H show the results of change processing performed on the recognition patterns 40 of the alignment cell data 24 arranged in different arrangement angles based on the first condition verification requirement. As shown in FIGS. 14A to 14H, if the size of the first pattern 41 is changed in correspondence with the first condition verification requirement, the first pattern indicated by the size changed first pattern data is configured to make contact with both the second pattern 42 and the third pattern 43 when the alignment cell data 24 including the recognition pattern 40 in the first condition is properly arranged. As described above, the verification data 25 holds data for judging at this point that the arrangement condition is the first condition. Thus, the verification execution part 32, based on the results of processing performed by the resizing execution part 31 described above and the verification data 25, can verify the layout condition of the alignment cell data 24 with high accuracy.

FIGS. 15A to 15H are layout pattern diagrams illustrating transition of layout patterns when the size of the first pattern is changed based on the second condition verification requirement with respect to the second condition as a reference. Of FIGS. 15A to 15H, as in FIGS. 14A to 14H described above, FIG. 15A shows the layout pattern when the alignment cell data 24 having the recognition pattern 40 in the second condition is properly arranged, and FIGS. 15B to 15H show the layout patterns when the alignment cell data 24 having the recognition pattern 40 in the second condition is so arranged as to be turned or reversed for some reason.

The first pattern data changing target portions 54 indicated by the second condition verification requirement in the resizing requirement data 23 are the first pattern second side 41b and the first pattern third side 41c. Thus, the resizing execution part 31, for the first patterns 41 shown in FIGS. 15A to 15H, specifies the side placed in the +X direction and the side placed in the +Y direction as the first pattern second side 41b and the first pattern third side 41c, respectively. Referring to the change amounts 55 relating to the second condition verification requirement, the change amount 55 for the first pattern second side 41b is the first length (set to be equal to the first distance D1), and the change amount 55 for the first pattern third side 41c is the second length (set to be equal to the second distance D2). The change direction 56 for the first pattern second side 41b is the +X direction, and the change direction 56 for the first pattern third side 41c is the +Y direction.

Referring to FIGS. 15A to 15H, the resizing execution part 31, based on these requirements, changes the size of the first pattern 41 to generate the size changed first pattern data. FIGS. 15A to 15H show the results of change processing performed on the recognition patterns 40 of the alignment cell data 24 with different arrangement angles based on the second condition verification requirement. When size change processing is executed on the first pattern 41 based on the second condition verification requirement, the first pattern indicated by the size changed first pattern data is configured to make contact with both the second pattern 42 and the third pattern 43 when the alignment cell data 24 including the recognition pattern 40 in the second condition is properly arranged (when configured in the condition shown in FIG. 15A). The verification execution part 32, as is the case with the first condition verification requirement, based on the results of the size change processing executed in correspondence with the second condition verification requirement and data obtained from the verification data 25, can verify whether or not the alignment cell data 24 including the recognition pattern 40 in the second condition is properly arranged.

The layout pattern verification device 10 of the present embodiment specifies a reference condition (angle or posture relatively defined to the substrate) of the recognition pattern 40 and performs the layout verification by using a verification requirement in correspondence with this reference condition to thereby achieve layout pattern verification with high accuracy. Moreover, as described above, even in any of the first to eighth conditions where the recognition pattern 40 is arranged, the arrangement in that condition can serve as a reference, thus permitting executing highly versatile layout verification.

Second Embodiment

Hereinafter, a second embodiment of the present invention will be described. In the second embodiment described below, a device which performs layout pattern verification has the same configuration as that of the layout pattern verification device 10 in the first embodiment described above. Therefore, a detailed description of the parts common to the first and second embodiments in this device will be omitted from the description below.

Figure 16:
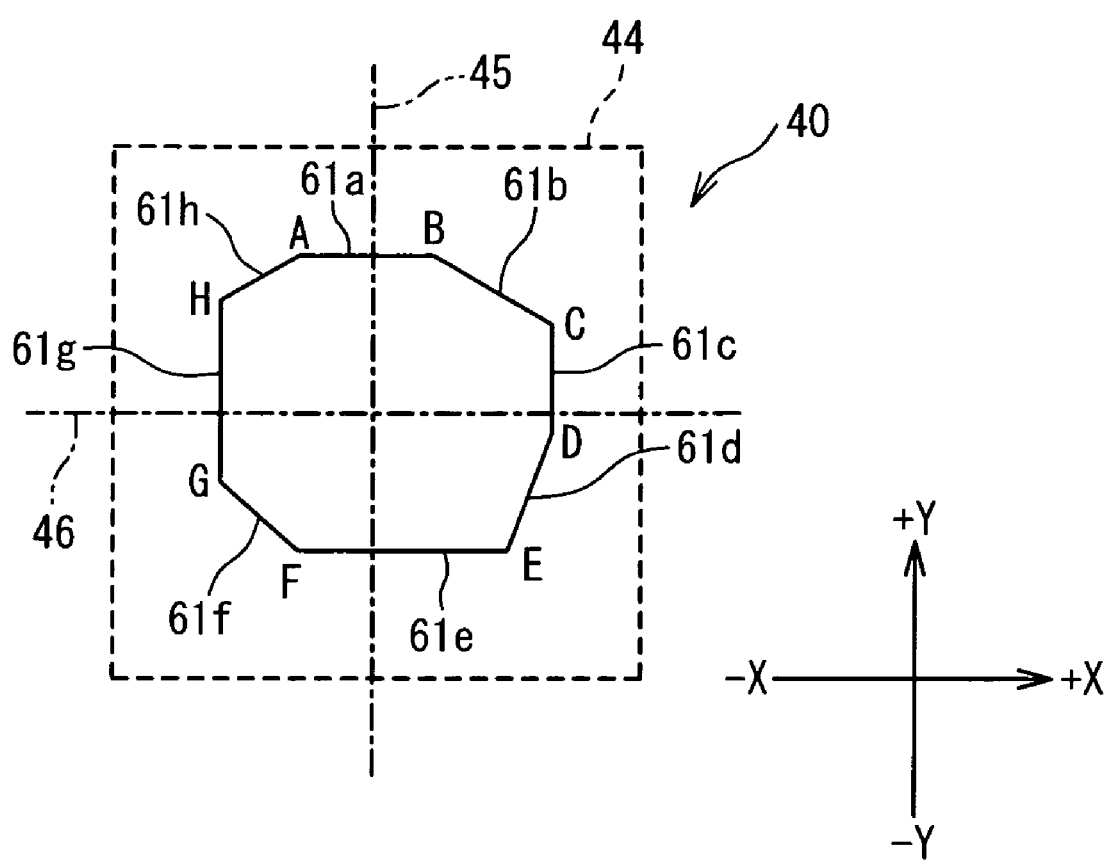
FIG. 16 is a layout pattern diagram illustrating the configuration of the recognition pattern 40 in a second embodiment.

FIG. 16 is a layout pattern diagram illustrating the configuration of a recognition pattern 40 in the second embodiment. In the second embodiment to be described below, the recognition pattern 40 is an inequilateral polygon having a first vertex A to an eighth vertex H, and thus the recognition pattern 40 in the second embodiment is formed of a polygon with all sides (first side 61a to eighth side 61h) having mutually different lengths. In the second embodiment, it is preferable that a polygon forming a recognition pattern have four or more sides. Hereinafter, a description will be given, illustrating a case where the recognition pattern 40 has eight sides. Referring to FIG. 16, the recognition pattern 40 in the second embodiment is arranged in a region 44 in the same manner as in the first embodiment. As shown in FIG. 16, this region 44 has a first symmetric axis 45 and a second symmetric axis 46 and is configured as to be symmetric with respect to each symmetric axis. The recognition pattern 40 is formed as a single polygon which is asymmetric when reversed with respect to the first symmetric axis 45 and also asymmetric when reversed with respect to the second symmetric axis 46.

FIG. 17 is a table illustrating the configuration of resizing requirement data 23 in the second embodiment. Referring to FIG. 17, the resizing requirement data 23 in the second embodiment is so configured as to have from conditions 62 to verification target lengths 67. The conditions 62, the direction specification patterns 63, and the verification requirements 64 have the same configuration as those of the conditions 51, the direction specification patterns 52, and the verification requirements 53, respectively, of the first embodiment.

The change target vertexes 65 indicate vertexes to be resized (more precisely, the vertexes are moved so that the recognition pattern is resized). The change directions 66 indicate resizing directions of the vertexes indicated by the change target vertexes 65. The resizing amounts (the length through which the vertex are moved) are not necessarily specified. The verification target lengths 67 indicate lengths between the two vertexes, of the change target vertexes 65, used for verification. In the second embodiment, the configuration of the recognition pattern 40 is not limited to the arrangement shown in FIG. 16. A layout pattern verification device 10 of the second embodiment also can execute the layout verification, as is the case with that of the first embodiment, assuming configurations of the recognition pattern 40 turned or reversed as a first to an eighth conditions. In the second embodiment, with the condition shown in FIG. 16 provided as a reference, an identifier (for example, a vertex A or the like) provided to each vertex of the recognition pattern 40 arranged in the region 44 is fixedly defined by the center of gravity and internal coordinates of the recognition pattern 40. Therefore, in the second embodiment, it is preferable that the data storage section 11 hold pattern data in each of the first to eighth conditions as the recognition pattern data 21.

Figure 18:
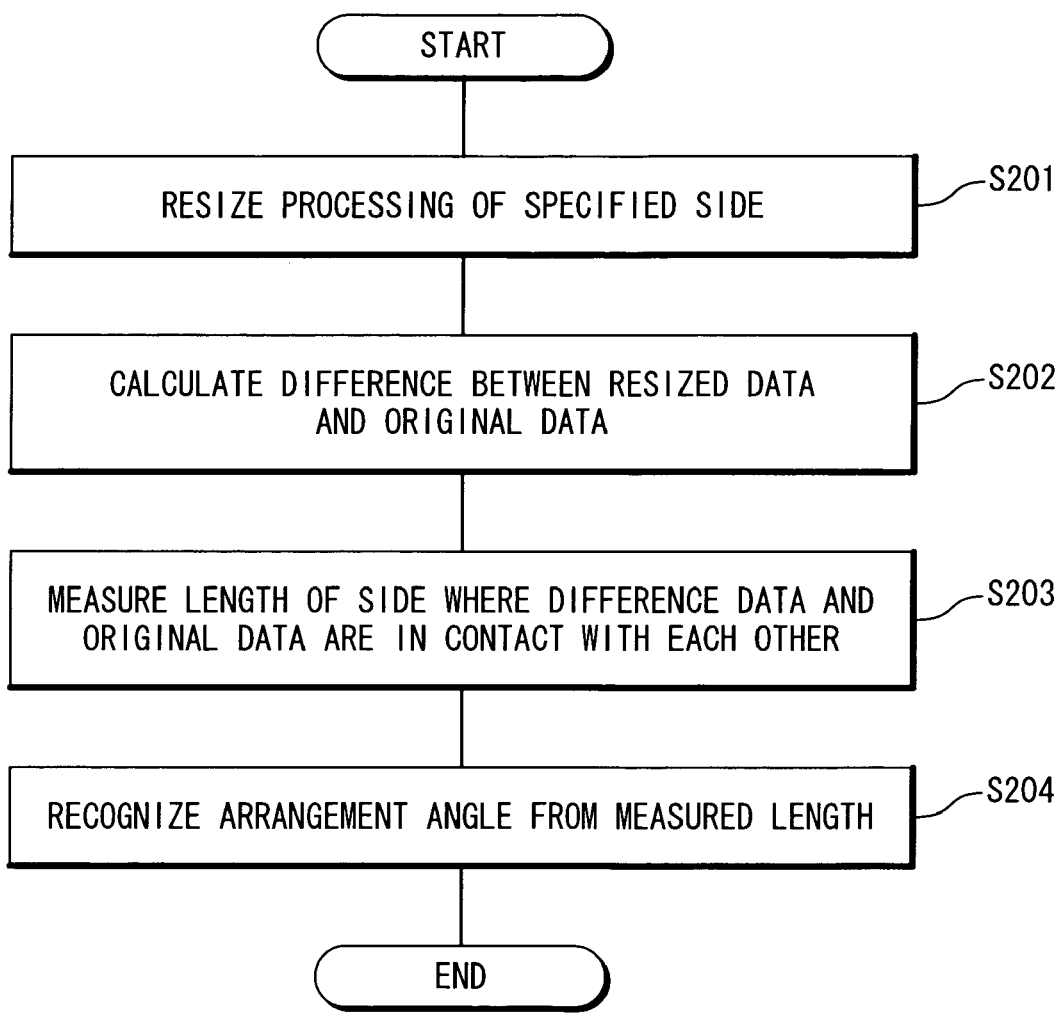
FIG. 18 is a flow chart illustrating the operation performed in the second embodiment.

FIG. 18 is a flow chart illustrating the operation performed in the second embodiment. The operation performed in the second embodiment starts in response to the layout verification execution command. The operation described below is executed by operation of an information processing device 1 based on the procedures indicated by computer programs of the resizing execution part 31 and the verification execution part 32. In the operation below, assuming that the recognition pattern 40 of the second embodiment is arranged in the alignment cell data 24 in the first condition (arrangement condition shown in FIG. 16), a description will be given, for a case where the layout verification of the alignment cell data 24 is executed. Here, information of the recognition pattern 40 when the alignment cell data 24 is properly arranged is previously registered.

Referring to FIG. 18, in step S201, the information processing device 1, in accordance with the procedures indicated by the resizing execution part 31, reads the resizing requirement data 23 from the data storage section 11. The resizing execution part 31, based on the verification requirement 64 of the read resizing requirement data 23, specifies, from the vertexes forming the polygonal recognition pattern 40, the vertexes to be changed. The resizing execution part 31 moves the vertexes specified based on the verification requirement 64 in the change direction 66 by a predetermined length (for example, 1 um) to change the form of the recognition pattern 40, and generate size changed recognition pattern data.

In step S202, the information processing device 1, in accordance with the procedures indicated by the verification execution part 32, generates difference data indicating the difference between the pattern indicated by the size changed recognition pattern data and the recognition pattern 40. In step S203, the verification execution part 32, based on the recognition pattern 40 and the difference data, specifies the vertexes to be verified, and calculates the verification target length, the length spanned between the specified vertexes (hereinafter, referred to as a verification target length).

In step S204, the verification execution part 32 verifies whether or not the calculated verification target length coincides with the length drawn from the recognition pattern 40 when the alignment cell data 24 is properly arranged, and then obtains the arrangement angle of the alignment cell data 24 based on the result of this verification.

Figure 19A:
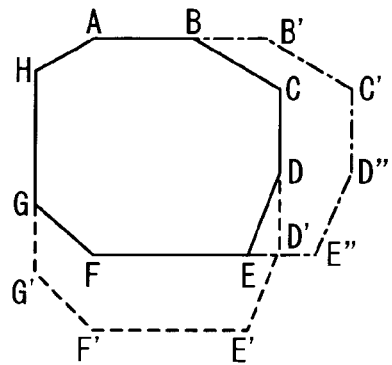
FIGS. 19A to 19H are layout pattern diagrams illustrating layout patterns when the size of a recognition pattern 40 of the second embodiment is changed.
Figure 19B:
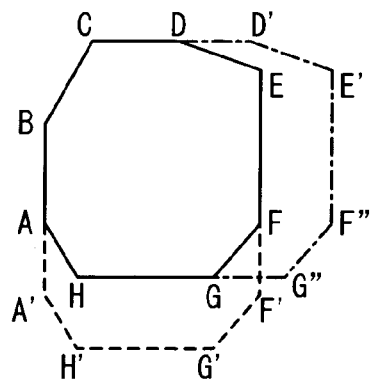
Figure 19C:
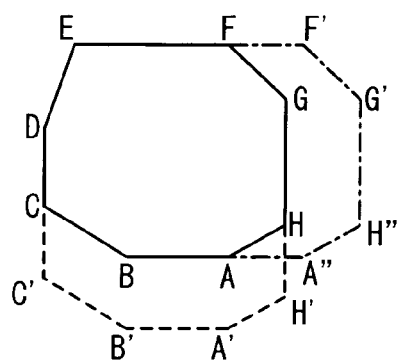
Figure 19D:
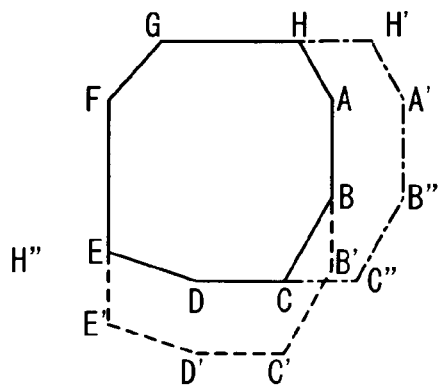
Figure 19E:
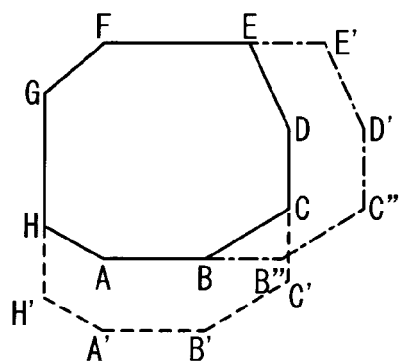
Figure 19F:
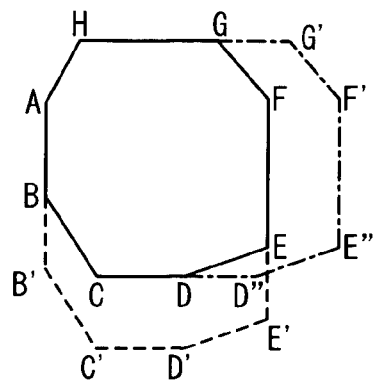
Figure 19G:
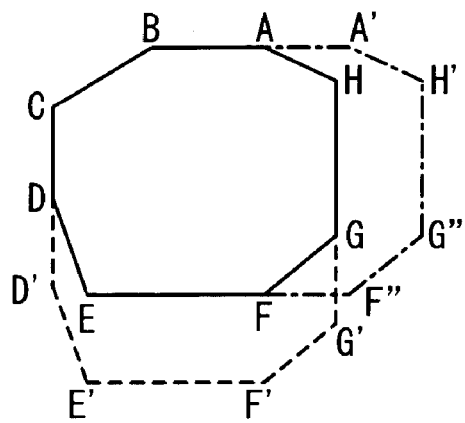
Figure 19H:
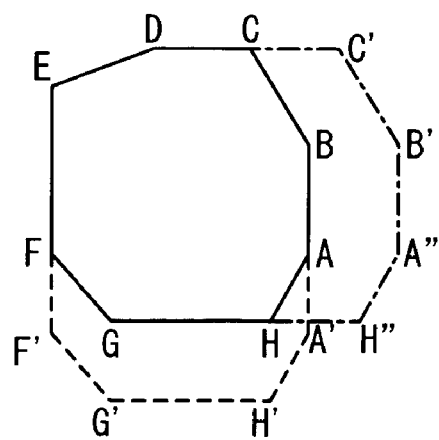

The operation of generating the size changed recognition pattern data in the second embodiment will be described referring to the accompanying drawings. FIGS. 19A to 19H are layout pattern diagrams illustrating layout patterns when the size of the recognition pattern 40 of the second embodiment is changed with respect to the first condition as a reference based on the first condition verification requirement. In the description below, FIG. 19A shows the layout pattern when the alignment cell data 24 having the recognition pattern 40 in the first condition is properly arranged, and FIGS. 19B to 19H show the layout patterns when the alignment cell data 24 having the recognition pattern 40 in the first condition is so arranged at to be turned or reversed for some reason.

Referring to FIGS. 19A to 19H, the resizing execution part 31 which has read the resizing requirement data 23 from the data storage section 11, based on the first condition verification requirement of this resizing requirement data 23, specifies, from the vertexes of the recognition pattern 40, the vertexes to be changed (change target vertexes 65). At this point, the resizing execution part 31, based on the change target vertexes 65 of the resizing requirement data 23, specifies the vertexes located in the −Y direction and the +X direction when the first symmetric axis 45 (or the second symmetric axis 46) overlapping the recognition pattern 40 is provided as a reference.

Thereafter, in accordance with the change directions 66, each vertex is moved by a predetermined amount of movement. In correspondence with the first condition verification requirement, the size of the recognition pattern 40 in the second embodiment is changed, and as a result, size changed recognition pattern data as shown in FIGS. 19A to 19H are formed. Here, the verification execution part 32 compares the size changed recognition pattern data with the recognition pattern 40 to extract difference data indicating the difference between them. For example, when size change processing is executed in the condition shown in FIG. 19A, a figure enclosed by G-F-E-D-D'-E' -F' -G' and a figure enclosed by B-C-D-E"-D'" -C' -B' are extracted as difference data. The verification execution part 32, based on the extracted difference data and the original data of the recognition pattern 40, specifies the length of a side to be compared with the verification target length 67.

As shown in FIGS. 19A to 19H, the layout pattern that can be specified as having the same length as the verification target length 67 indicated by the first condition verification requirement is the condition of FIG. 19A. Therefore, the layout pattern verification device 10 in the second embodiment can execute the layout verification with the high accuracy through the configuration and operation described above.

Third Embodiment

Hereinafter, the third embodiment of the present invention will be described. In the third embodiment, a device which executes the layout pattern verification has the same configuration as that of the layout pattern verification devices 10 in the first and second embodiments described above. Therefore, as is the case with the second embodiment, a detailed description of this device will be omitted from the description below.

Figure 20:
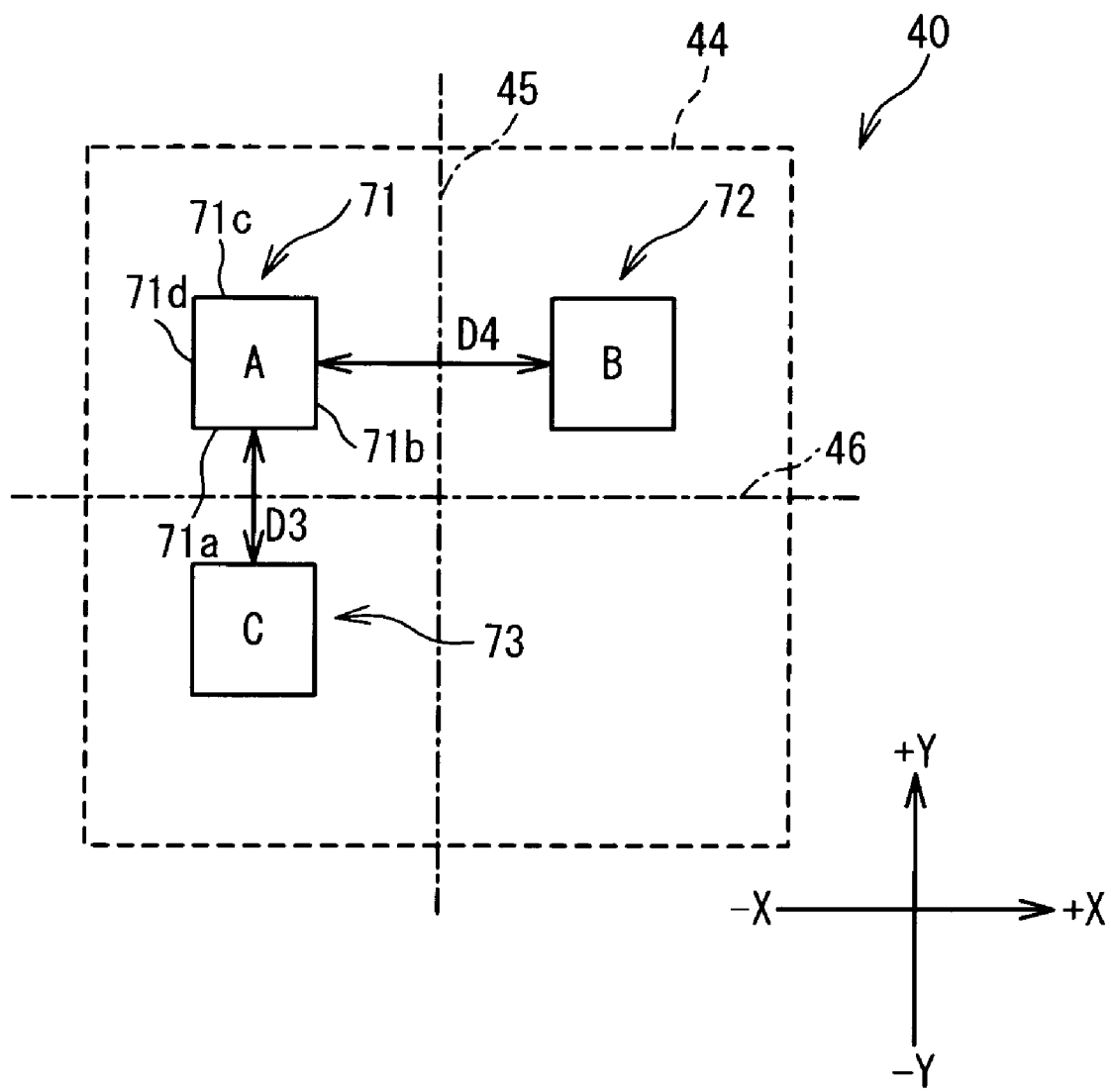
FIG. 20 is a layout pattern diagram illustrating the configuration of a recognition pattern 40 of a third embodiment.
Figure 21A:
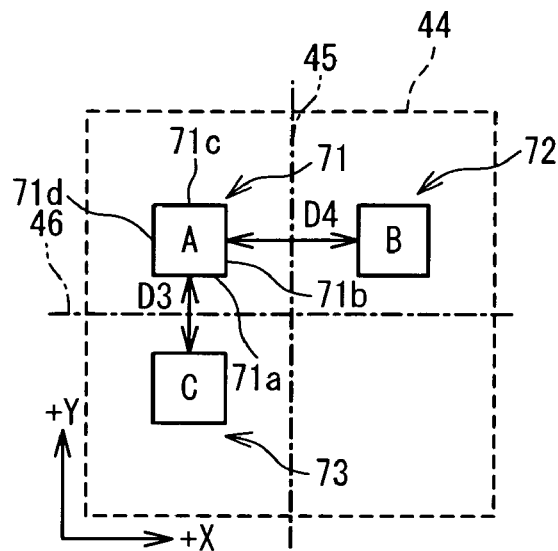
FIGS. 21A to 21H are layout pattern diagrams illustrates a plurality of patterns (71, 72, and 73) forming the recognition pattern 40 of the third embodiment.
Figure 21B:
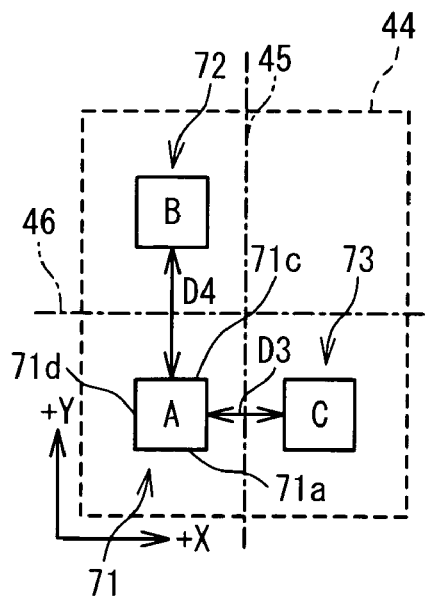
Figure 21C:
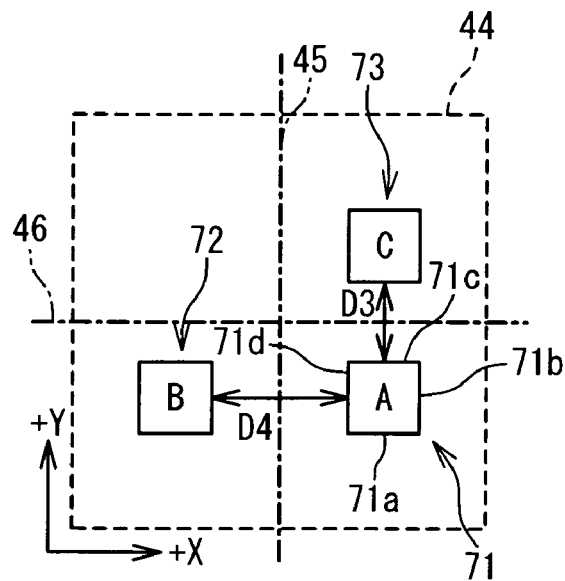
Figure 21D:
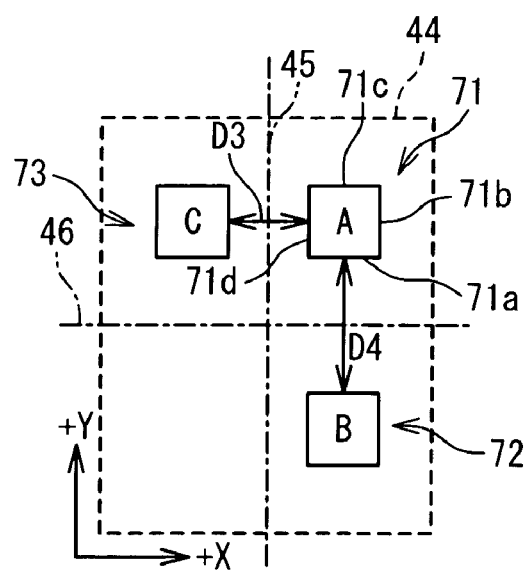
Figure 21E:
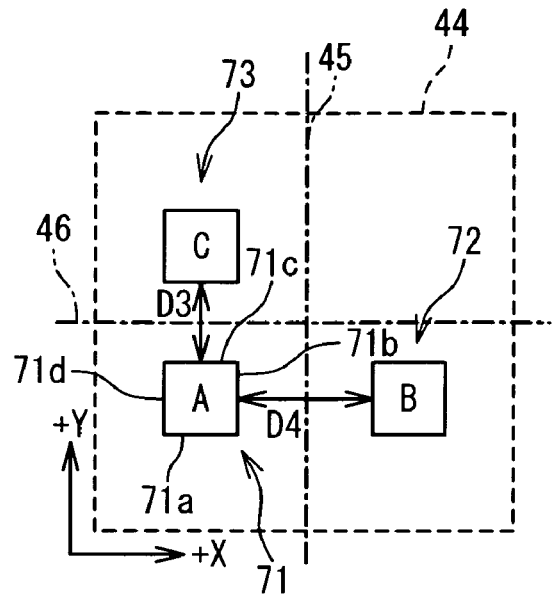
Figure 21F:
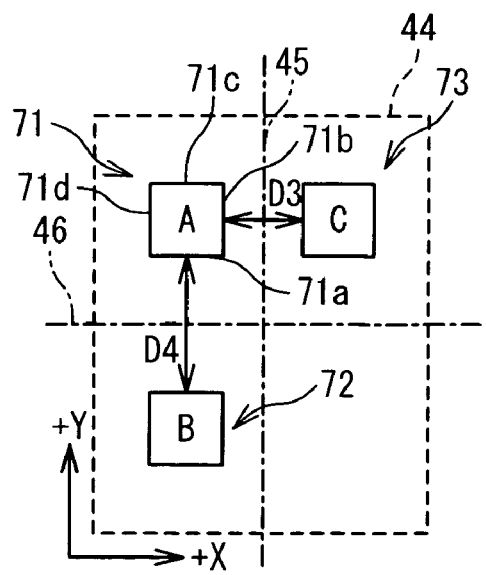
Figure 21G:
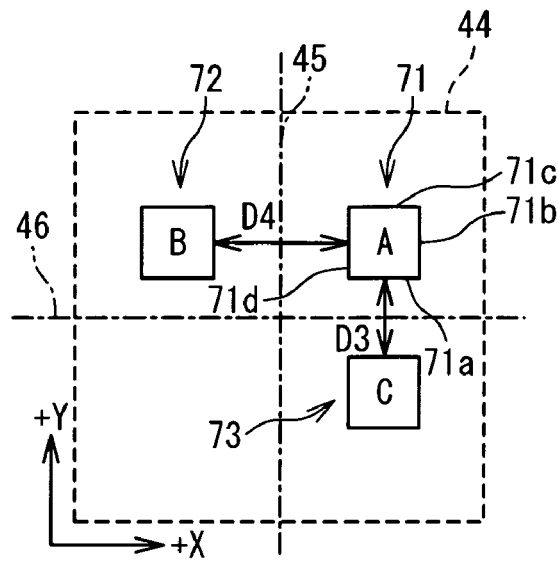
Figure 21H:
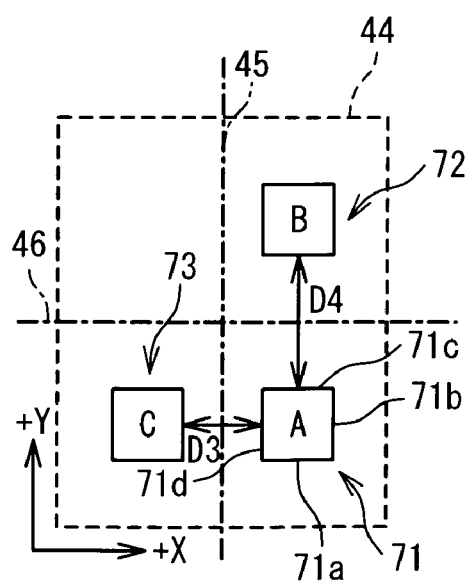

FIG. 20 is a layout pattern diagram illustrating the configuration of a recognition pattern 40 of the third embodiment of the present invention. Referring to FIG. 20, the recognition pattern 40 of the third embodiment is arranged in a region 44. The recognition pattern 40 is configured to include a first pattern 71, a second pattern 72, and a third pattern 73. In the third embodiment, the patterns are formed of the same shape. In the description below, every pattern is rectangle data having sides of the same length. As shown in FIG. 20, the first pattern 71 and the third pattern 73 are arranged at an interval of a first distance D3, and the first pattern 71 and the second pattern 72 are arranged at an interval of a second distance D4.

Further, as shown in FIG. 20, the first pattern 71 has four sides (a first pattern first side 71a, a first pattern second side 71b, a first pattern third side 71c, and a first pattern fourth side 71d). In the third embodiment, the side in the −Y direction is defined as the first pattern first side 71a, the side in the +X direction is defined as the first pattern second side 71b, the side in the +Y direction is defined as the first pattern third side 71c, and the side in the −X direction is defined as the first pattern fourth side 71d. Therefore, in the case of the layout shown in FIG. 20, the third pattern 73 is arranged at an interval of the first distance D3 from the first pattern first side 71a, and the second pattern 72 is arranged at an interval of the distance D4 from the first pattern second side 71b. In the third embodiment, a case is illustrated in which each side of the first pattern 71 to the third pattern 73 is 1 um long, the first distance D3 is 1 um long, and the second distance D4 is 2 um long.

Also in the third embodiment, the configuration of a recognition pattern in an initial condition is not limited to the arrangement shown in FIG. 20. FIGS. 21A to 21H are layout pattern diagrams illustrating the arrangement of the patterns (71, 72, and 73) forming the recognition pattern 40. Hereinafter, in the description of the third embodiment, the configuration shown in FIGS. 21A to 21H are referred as a first to an eighth conditions respectively. In the third embodiment, a layout condition can be verified with respect to each of the first to eighth conditions as a reference. Each of the first to eighth conditions, when one of them is specified, can be formed by turning or reversing the specified condition. Therefore, by registering at least one of the first to eighth conditions as the recognition pattern 40, the recognition patterns 40 in correspondence with the respective conditions can be generated automatically.

FIG. 22 is a table illustrating the configuration of resizing requirement data 23 in the third embodiment. Referring to FIG. 22, the resizing requirement data 23 of the third embodiment holds conditions 81, direction specification patterns 82, verification requirements 83, first pattern change target portions 84, change directions 85, and change amounts 86. Here, held in the conditions 81, the direction specification patterns 82, and the verification requirements 83 are the same information as those in the conditions 51, the direction specification patterns 52, and the verification requirements 53 in the first embodiment.

The first pattern change target portions 84 indicate portions to be resized when the respective verification requirements are specified. The change directions 85 indicate resizing directions for portions to be resized when the respective verification requirements are specified. The change amounts 86 indicate resizing amounts for portions to be resized when the respective verification requirements are specified.

FIG. 23 is a table illustrating the configuration of verification data 25 in the third embodiment. Referring to FIG. 23, the verification data 25 in the third embodiment holds information for making association between results of size change processing executed on the first pattern 71 of the recognition pattern 40 and the arrangement conditions of the recognition pattern 40 (first to eighth conditions described above). As described later, as a result of executing the size change processing, the size of each of the patterns (the first pattern 71 to the third pattern 73) which forms the recognition pattern 40 changes. The layout pattern verification device 10 of the third embodiment performs the layout verification based on a combination of sizes of the patterns which have been changed.

Figure 24:
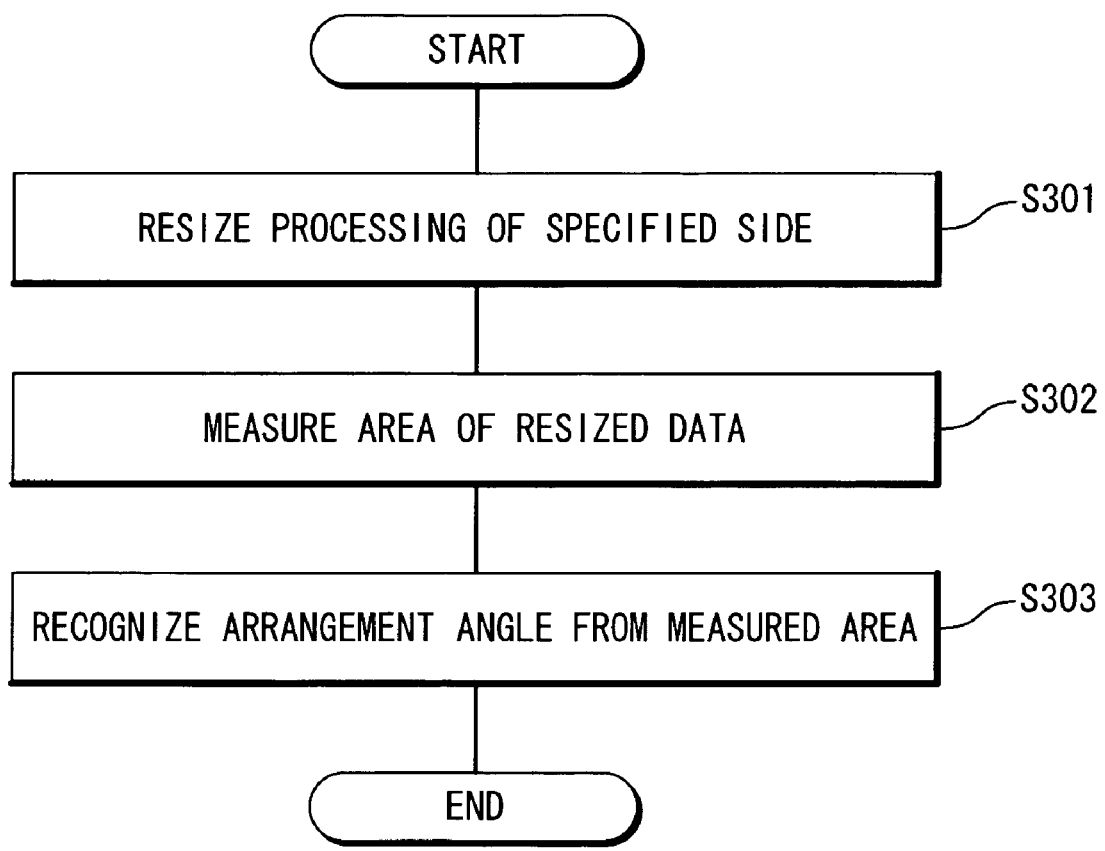
FIG. 24 is a flow chart illustrating the operation of the third embodiment.

FIG. 24 is a flow chart illustrating the operation of the third embodiment. The operation of the third embodiment starts in response to the layout verification execution command. The operation to be described below is, based on procedures indicated by computer programs of the resizing execution part 31 and the verification execution part 32, executed by operating of the information processing device 1. In the following explanation of the operation relating to the FIG. 24, it is assumed that the recognition pattern 40 of the third embodiment is arranged in the alignment cell data 24 in the first condition (arrangement condition shown in FIG. 20) and the layout verification of the alignment cell data 24 is performed.

Referring to FIG. 24, in step S301, the information processing device 1, based on procedures indicated by the resizing execution part 31, reads the layout information 22 from the data storage section 11 to specify the layout pattern of the verification target. At this point, the resizing execution part 31 reads the resizing requirement data 23 from the data storage section 11, and based on the read layout information 22 and the resizing requirement data 23, changes the size of the first pattern 71 of the recognition pattern 40 in the specified layout pattern, and then generates the size changed first pattern data.

In step S302, the verification execution part 32, based on the size changed first pattern data generated in step S301, specifies the area of the pattern after the size processing is executed. In step S303, the verification execution part 32 reads the verification data 25 from the data storage section 11 and compares the area specified in step S302 with the information obtained from the verification data 25. The verification execution part 32, based on a result of this comparison, specifies the arrangement angle of the alignment cell data 24.

Figure 25A:
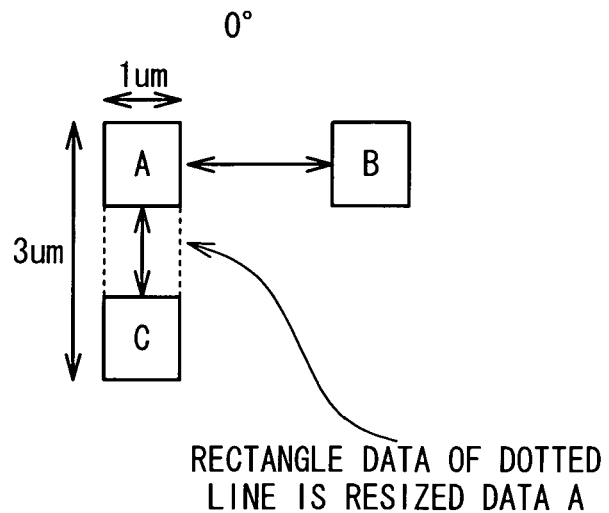
FIGS. 25A and 25B are layout pattern diagrams showing patterns when size change processing is executed on the recognition pattern 40.
Figure 25B:
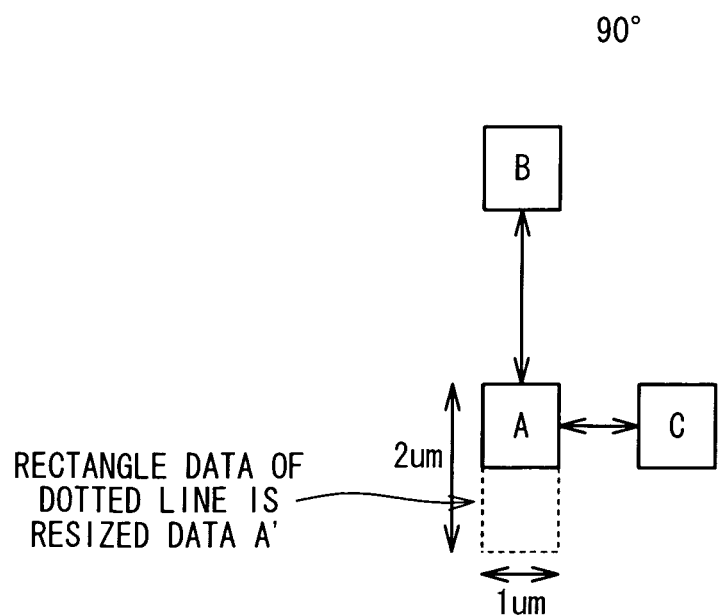

Hereinafter, the operation described above will be described in detail referring to the drawings. FIGS. 25A and 25B are layout pattern diagrams showing patterns when size change processing is executed on the recognition pattern 40 with the configuration described above and through the operation described above. FIGS. 25A and 25B illustrates the alignment cell data 24 having the recognition patterns 40 of the third embodiment arranged at different arrangement angles and results of size change processing executed on the recognition patterns 40 of the alignment cell data 24. FIGS. 25A and 25B also show results of layout verification executed when the recognition pattern 40 in the first condition is arranged in the alignment cell data 24. Here, FIG. 25A shows an arrangement condition of the alignment cell data 24 described above properly arranged, and FIG. 25B shows a condition of the alignment cell data 24 described above not properly arranged for some reason.

As shown in FIGS. 25A and 25B, the information processing device 1, in accordance with the operation in the flow chart described above, specifies the recognition pattern 40 of the alignment cell data 24, and executes size change processing on the first pattern 71 forming the specified recognition pattern 40. Referring to FIGS. 25A and 25B, the resizing execution part 31 which has read the resizing requirement data 23 from the data storage section 11, based on the first condition verification requirement of this resizing requirement data 23, specifies, from among the sides forming the first pattern 71, the sides to be changed (first pattern change target portions 84). Here, since the first pattern change target portions 84 indicated by the first condition verification requirement are the first pattern first side 71a and the first pattern second side 71b, the resizing execution part 31, for the first patterns 41 in the respective conditions shown in FIGS. 25A and 25B, specifies the side placed in the +X direction and the side placed in the −Y direction as the first pattern first side 41a and the first pattern second side 41b, respectively.

The resizing execution part 31, by referring to the change directions 85 of the resizing requirement data 23, determines the change directions for the sides specified. The resizing execution part 31, by referring to the change amounts 86 of the resizing requirement data 23, also determines the change amounts for the sides specified. Here, referring to the change amounts 86 indicated by the first condition verification requirement, the change amount 86 for the first pattern first side 71a is the first distance D3 and the change amount 86 for the first pattern second side 71b is the second distance D4. The change direction 85 for the first pattern first side 71a is the −Y direction, and the change direction 85 for the first pattern second side 71b is the +X direction.

The resizing execution part 31, based on these requirements, changes the size of the first pattern 71 to generate the size changed first pattern data. In FIGS. 25A and 25B, results of change processing performed under the first condition verification requirement on the recognition patterns 40 of the alignment cell data 24 at different arrangement angles are shown.

In a case where the size of the first pattern 71 is changed in correspondence with the first condition verification requirement, when the alignment cell data 24 including the recognition pattern 40 in the first condition is properly arranged, the area of the pattern obtained as a result of the size change processing performed in the −Y direction and the area of the pattern obtained as a result of the size change processing performed in the +X direction are provided in a particular combination. Here, the information processing device 1 of the layout pattern verification device 10, in accordance with the procedures indicated by the verification execution part 32, reads the verification data 25, and performs the layout verification. The verification data 25 as described above holds, as data, a combination of pattern areas for judging that the arrangement condition at this point is the first condition. Thus, the verification execution part 32, based on the processing result of the resizing execution part 31 and the verification data 25 described above, can verify the layout condition of the alignment cell data 24 (arrangement angle) with high accuracy.

As described above, by configuring the layout pattern verification device 10 of the embodiments described above and by causing the layout pattern verification device 10 to operate in accordance with the procedures described above, the layout is verified higher accuracy. In this specification, a plurality of embodiments are illustrated to describe the present invention. In the description of the present invention, the plurality of embodiments correspond to a plurality of patterns having the recognition patterns 40 with different configurations. In the present invention, the configurations of the recognition patterns 40 are not limited to the recognition patterns 40 shown in the respective embodiments.

The plurality of embodiments described above can be implemented in combination unless no inconsistency arises in the configuration and the operation.

What is claimed is:

1. A semiconductor design support apparatus comprising:
   a pattern data generation unit configured to generate a pattern data of a recognition pattern which is arranged in a region symmetric about both of a first axis and a second axis orthogonal to said first axis and formed to be asymmetric about both of said first and second axes;
   a layout execution unit configured to determine a layout of a macrocell in which said recognition pattern is arranged to generate layout pattern data; and a layout verification unit configured to read out said pattern data of said recognition pattern arranged in said macrocell based on said layout pattern data to verify an arrangement direction of said macrocell based on said recognition pattern indicated in said read out pattern data, wherein said layout verification unit memorizes data of a pattern obtained through a predetermined figure calculation processing applied to said recognition pattern included in said macrocell arranged in an arbitral direction, and verifies an arrangement direction of said macrocell by using a verification target pattern which is obtained through said predetermined figure calculation processing applied to said recognition pattern indicated by a pattern data read out from said layout pattern data and by using said verification data, wherein said recognition pattern includes: a first pattern; a second pattern placed a first distance away from said first pattern; and a third pattern placed a second distance away from said first pattern, said pattern data generation unit is configured to form said recognition pattern in which said first pattern and said second pattern are aligned in said first axis, and said first pattern and said third pattern are aligned in said second axis, and said first distance and said second distance are different, and said layout verification unit is configured to generate a deformed first pattern by deforming said first pattern based on a first length corresponding to said first distance.

2. The semiconductor design support apparatus according to claim 1, wherein said layout verification unit is further configured to generate said deformed first pattern by deforming said first pattern based on a second length corresponding to said second distance, and to verify an arrangement direction of said macrocell based on a judgment whether said deformed first pattern contacts with said second pattern or not.

3. The semiconductor design support apparatus according to Previously Presented claim 1, wherein said layout verification unit is further configured to verify an arrangement direction of said macrocell based on a shape of said deformed first pattern.

4. A computer-readable medium storing a computer program for instructing a computer to execute a method of layout verification in semiconductor design comprising:

(a) generating a pattern data of a recognition pattern which is arranged in a region symmetric about both of a first axis and a second axis orthogonal to said first axis and formed to be asymmetric about both of said first and second axes;

(b) determining a layout of a macrocell in which said recognition pattern is arranged to generate layout pattern data;

(c) reading out said pattern data of said recognition pattern arranged in said macrocell based on said layout pattern data; and (d) verifying an arrangement direction of said macrocell based on said recognition pattern indicated in said read out pattern data, wherein said (d) verifying includes:

reading out a verification data which includes a pattern obtained by executing a predetermined figure calculation processing applied to said recognition pattern arranged in said macrocell; and verifying an arrangement direction of said macrocell by using a verification target pattern which is obtained through said predetermined figure calculation processing applied to said recognition pattern indicated by a pattern data read out from said layout pattern data and by using said verification data, wherein said recognition pattern includes:

a first pattern;

a second pattern placed a first distance away from said first pattern; and a third pattern placed a second distance away from said first pattern, said (a) generating includes:

forming said recognition pattern in which said first pattern and said second pattern are aligned in said first axis, and said first pattern and said third pattern are aligned in said second axis, and said first distance and said second distance are different, and said (d) verifying includes:

generating a deformed first pattern by deforming said first pattern based on a first length corresponding to said first distance.

5. The computer-readable medium according to claim 4, wherein said (d) verifying further includes:

generating said deformed first pattern by deforming said first pattern based on a second length corresponding to said second distance; and verifying an arrangement direction of said macrocell based on a judgment whether said deformed first pattern contacts with said second pattern or not.

6. The computer-readable medium according to claim 4, wherein said (d) verifying further includes:

verifying an arrangement direction of said macrocell based on a shape of said deformed first pattern.

7. A layout pattern verification method comprising:

(a) generating, via a pattern data generation unit of a semiconductor design support apparatus, a pattern data of a recognition pattern which is arranged in a region symmetric about both of a first axis and a second axis orthogonal to said first axis and formed to be asymmetric about both of said first and second axes;

(b) determining, via a layout execution unit of said semiconductor design support apparatus, a layout of a macrocell in which said recognition pattern is arranged to generate layout pattern data;

(c) reading out, via a layout verification unit of said semiconductor design support apparatus, said pattern data of said recognition pattern arranged in said macrocell based on said layout pattern data; and (d) verifying, via said layout verification unit, an arrangement direction of said macrocell based on said recognition pattern indicated in said read out pattern data, wherein said (d) verifying includes:

reading out a verification data which includes a pattern obtained by executing a predetermined figure calculation processing applied to said recognition pattern arranged in said macrocell; and verifying an arrangement direction of said macrocell by using a verification target pattern which is obtained through said predetermined figure calculation processing applied to said recognition pattern indicated by a pattern data read out from said layout pattern data and by using said verification data wherein said recognition pattern includes:
a first pattern;
a second pattern placed a first distance away from said first pattern; and
a third pattern placed a second distance away from said first pattern,
said (a) generating includes:
forming said recognition pattern in which said first pattern and said second pattern are aligned in said first axis, and said first pattern and said third pattern are aligned in said second axis, and said first distance and said second distance are different, and
said (d) verifying includes:
generating a deformed first pattern by deforming said first pattern based on a first length corresponding to said first distance.

8. The layout pattern verification method according to claim 7, wherein
said (d) verifying further includes:
generating said deformed first pattern by deforming said first pattern based on a second length corresponding to said second distance; and
verifying an arrangement direction of said macrocell based on a judgment whether said deformed first pattern contacts with said second pattern or not.

9. The layout pattern verification method according to claim 7, wherein
said (d) verifying further includes:
verifying an arrangement direction of said macrocell based on a shape of said deformed first pattern.

* * * * *